United States Patent
Fujii et al.

(10) Patent No.: US 8,975,506 B2
(45) Date of Patent: Mar. 10, 2015

(54) SOLAR CELL MODULE AND PHOTOVOLTAIC POWER GENERATOR USING THE SAME

(75) Inventors: Shuichi Fujii, Higashiomi (JP); Yosuke Inomata, Higashiomi (JP); Tomonari Sakamoto, Higashiomi (JP); Koichiro Niira, Higashiomi (JP); Yuko Fukawa, Ise (JP); Hiroshi Morita, Ise (JP); Koji Nishi, Ise (JP); Tatsuya Yashiki, Ise (JP); Mitsuo Yamashita, Ise (JP); Kenji Fukui, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/273,056

(22) Filed: Oct. 13, 2011

(65) Prior Publication Data

US 2012/0260964 A1 Oct. 18, 2012

Related U.S. Application Data

(62) Division of application No. 10/599,539, filed as application No. PCT/JP2005/006548 on Mar. 29, 2005.

(30) Foreign Application Priority Data

| Mar. 29, 2004 | (JP) | 2004-096809 |
| Jun. 10, 2004 | (JP) | 2004-172852 |
| Jun. 10, 2004 | (JP) | 2004-173177 |
| Jun. 10, 2004 | (JP) | 2004-173178 |
| Jun. 30, 2004 | (JP) | 2004-194779 |

(51) Int. Cl.
*H01L 31/042* (2014.01)
*H01L 31/02* (2006.01)
(Continued)

(52) U.S. Cl.
CPC ........... *H01L 31/0504* (2013.01); *H01L 31/048* (2013.01); *H01L 31/02013* (2013.01); *Y02E 10/50* (2013.01); *H01L 31/022433* (2013.01); *H01L 31/0201* (2013.01)
USPC ............................ 136/244; 136/251; 136/256

(58) Field of Classification Search
CPC ..................... H01L 31/02013; H01L 31/0201; H01L 31/048; H01L 31/0504
USPC ........................................................ 136/244
See application file for complete search history.

(56) References Cited

U.S. PATENT DOCUMENTS

| 3,819,417 A | 6/1974 | Haynos |
| 4,540,843 A | 9/1985 | Gochermann et al. ........ 136/251 |

(Continued)

FOREIGN PATENT DOCUMENTS

| JP | 59-172779 | 9/1984 |
| JP | 64-020751 | 2/1989 |

(Continued)

OTHER PUBLICATIONS

English translation of Japanese office action dated Dec. 15, 2009 for corresponding Japanese application 2004194779.

(Continued)

*Primary Examiner* — Allison Bourke

(57) ABSTRACT

A surface electrode (5) is installed on the light receiving surface of a solar cell element, the surface electrode (5) comprises three bus bar electrodes (5a) for extracting light-produced at the solar cell element to the outside and collecting finger electrodes (5b) connected to these bus bar electrodes (5a), and the bus bar electrodes (5a) are not less than 0.5 mm and not more than 2 mm in width and the finger electrodes (5b) are not less than 0.05 mm and not more than 0.1 mm in width. A high-efficient solar cell module can be obtained with substantially lowered resistance by increasing the number of bus bar electrode (5a) and thereby decreasing the lengths of the finger electrodes (5b).

12 Claims, 14 Drawing Sheets

(51) Int. Cl.
*H01L 31/05* (2014.01)
*H01L 31/0224* (2006.01)
*H01L 31/048* (2014.01)

(56) References Cited

U.S. PATENT DOCUMENTS

| | | | |
|---|---|---|---|
| 4,886,555 | A | 12/1989 | Hackstein et al. |
| 5,151,377 | A | 9/1992 | Hanoka et al. |
| 5,441,577 | A * | 8/1995 | Sasaki et al. ............. 136/244 |
| 5,476,553 | A | 12/1995 | Hanoka et al. ............ 136/251 |
| 5,543,333 | A | 8/1996 | Holdermann |
| 5,726,065 | A | 3/1998 | Szlufcik et al. |
| 6,156,967 | A | 12/2000 | Ralph et al. ............... 136/244 |
| 6,184,457 | B1 | 2/2001 | Tsuzuki et al. |
| 6,218,606 | B1 * | 4/2001 | Morizane et al. .......... 136/251 |
| 6,268,559 | B1 * | 7/2001 | Yamawaki ................. 136/244 |
| 6,359,209 | B1 | 3/2002 | Glenn et al. |
| 6,573,445 | B1 | 6/2003 | Burgers |
| 2002/0179140 | A1 * | 12/2002 | Toyomura ................... 136/251 |
| 2003/0010377 | A1 * | 1/2003 | Fukuda et al. ............. 136/251 |
| 2003/0070706 | A1 | 4/2003 | Fujioka et al. ............. 136/251 |
| 2003/0178057 | A1 | 9/2003 | Fujii et al. .................. 136/256 |
| 2004/0003840 | A1 * | 1/2004 | Umemoto .................. 136/251 |
| 2004/0118444 | A1 * | 6/2004 | Duggal et al. .............. 136/244 |
| 2004/0200522 | A1 | 10/2004 | Fukawa et al. ............. 136/259 |
| 2005/0199279 | A1 | 9/2005 | Yoshimine et al. ......... 136/251 |
| 2006/0243318 | A1 * | 11/2006 | Feldmeier et al. .......... 136/244 |

FOREIGN PATENT DOCUMENTS

| | | |
|---|---|---|
| JP | 06-151907 | 5/1994 |
| JP | 6-151907 | 5/1994 |
| JP | 06-318723 | 11/1994 |
| JP | 07-326789 | 12/1995 |
| JP | 10-323344 | 12/1998 |
| JP | 11-017202 | 1/1999 |
| JP | 11186572 A | 7/1999 |
| JP | 11-307792 | 11/1999 |
| JP | 2000-114572 | 4/2000 |
| JP | 2000114572 A | 4/2000 |
| JP | 2000-332279 | 11/2000 |
| JP | 2001-203378 | 7/2001 |
| JP | 2001-339089 | 12/2001 |
| JP | 2002-111024 | 4/2002 |
| JP | 2002-353478 | 6/2002 |
| JP | 2002-530894 | 9/2002 |
| JP | 2003-124491 | 4/2003 |
| JP | 2003-234484 | 8/2003 |
| JP | 2003-273382 | 9/2003 |
| JP | 2004-140024 | 5/2004 |
| WO | 0031803 | 6/2000 |

OTHER PUBLICATIONS

English translation of Japanese office action dated May 18, 2010 for corresponding Japanese application 2004194779.
English translation of Japanese office action dated Aug. 3, 2010 for corresponding Japanese application 2004194779.
English translation of Japanese office action dated Dec. 15, 2009 for corresponding Japanese application 2007077097.
English translation of Japanese office action dated May 18, 2010 for corresponding Japanese application 2007077097.
English translation of Japanese office action dated Aug. 3, 2010 for corresponding Japanese application 2007077097.
Burgers et al., "Optimizing Metalization Patterns for Yearly Yield", Conference record of 26th IEEE Photovoltaic Specialists Conference, pp. 219-222, Oct. 1997.
English translation of Interrogation dated Jun. 28, 2011 for corresponding Japanese Application No. 2004-173177.
Serreze, "Optimizing Solar Cell Performance by Simultaneous Consideration of Grid Pattern Design and Interconnect Configuration" Conference Record, 13th IEEE Photovoltaic Specialists Conference, Washington, D.C., pp. 609-614, 1978.
Siemens, "Solar Module SR100" Brochure/Data Sheet, pp. 1-2, 1998.
Green, "Solar Cells—Operating Principles, Technology and Systems Applications" The University of New South Wales, pp. 156-157 and 160-161, Dec. 1998.
Green, "Solar Cells: Operating Principles, Technology and Systems Applications" The University of New South Wales, pp. 204-221, Feb. 1992.

* cited by examiner (G-G)

(H-H)

SOLAR CELL MODULE AND PHOTOVOLTAIC POWER GENERATOR USING THE SAME

CROSS-REFERENCE TO THE RELATED APPLICATIONS

This application is a divisional of application Ser. No. 10/599,539, filed on Aug. 9, 2007, which is a national stage of international application No. PCT/JP2005/006548, filed on Mar. 29, 2005, the entire contents of which are incorporated herein by reference. Also, this application claims the benefit of priority under 35 USC 119 of Japanese Patent Application No. 2004-096809, filed on Mar. 29, 2004, Japanese Patent Application No. 2004-173178, filed on Jun. 10, 2004, Japanese Patent Application No. 2004-172852, filed on Jun. 10, 2004, Japanese Patent Application No. 2004-173177, filed on Jun. 10, 2004 and Japanese Patent Application No. 2004-194779, filed on Jun. 30, 2004, the entire contents of all of which are incorporated herein by reference.

TECHNICAL FIELD

The present invention relates to a solar cell module using solar cell elements including a surface electrode on the light receiving surface thereof and a photovoltaic power generator using this.

BACKGROUND ART

A solar cell is a device for converting energy of incident light into electrical energy.

The major types of solar cells are classified into crystalline, amorphous and compound types. Most of the solar cells that are currently distributed in the market are crystalline silicon solar cells. The crystalline silicon solar cells are further classified into monocrystalline type and multicrystalline type. An advantage of monocrystalline silicon solar cells is that improvement of the conversion efficiency is easy because of the high quality of the substrates, while a disadvantage thereof is high production cost of the substrates.

On the other hand, multicrystalline silicon solar cells have a drawback that improvement of the conversion efficiency is difficult due to inferior quality of the substrates, and an advantage that they can be produced at low cost. In addition, with the recent improvement in substrate quality and progress in cell fabrication technology of multicrystalline silicon substrates, a conversion efficiency of about 18% has been achieved at research level.

Meanwhile, since multicrystalline silicon solar cells are mass-produced at low cost, they have conventionally been distributed in the market, and are today's mainstream solar cells.

In recent years, solar cells have been required to have even higher conversion efficiencies. Therefore, various approaches have been devised for the surface electrode (bus bar electrode, finger electrode) arranged on the light receiving surface.

Generally, for example, means such as decreasing optical loss (reflectional loss) by fine wiring, and forming finger electrodes and bus bar electrodes so as to cross orthogonal to each other so that electrons collected in the finger electrodes are carried to bus bar electrodes with minimum loss have been used.

Decreasing the electrode area of the surface electrode thereby to increase the light receiving area is one approach to meet the requirement of further improving the conversion efficiency of solar cells.

However, a problem is that, in particular, when finger electrodes are thinned to decrease the electrode area, the resistance within the electrode increases, resulting in loss.

To solve this problem, increasing the thickness of finger electrode thereby to increase the cross-section area within the electrode and reduce the resistance is considered. However, in reality, there is a limit to the thickness of electrodes when electrodes are formed by screen printing, and the desired thickness can only be obtained through a process including a plural times of printing, and by using expensive equipment, namely, that for sputtering or vapor deposition. This leads to the problem of increase in solar cell production cost.

It is therefore an object of the present invention to provide a solar cell module with a high conversion efficiency and a photovoltaic power generator using this, which is realized by reducing the substantial resistance by increasing the number of bus bar electrodes to reduce the lengths of finger electrodes.

A single solar cell element is seldom used alone, and usually, a plural number of them are connected together to be used as a solar cell module. This is because even the silicon solar cell element that is dominant in the market produces only a low voltage on the order of 600 V when used as a single element and is not practical, the cells therefore need to be series connected to increase the voltage.

While there are various uses of this solar cell module, the most typical use at present is installation of a plural number of solar cell modules on the roofs of general houses. For this use, the solar cell module is required to have a high conversion efficiency for efficient power generation within a limited installation area, and to have excellent design quality and beautiful appearance because the external appearance of a house depends on it.

In order to obtain a solar cell module with high efficiency, apart from using solar cell elements with high efficiency, there have been proposals such as forming irregularities on the glass on the surface of the solar cell module and forming an antireflective film on the surface of the glass so as to effectively introduce light into the solar cell module (refer to Patent Document 1, for example).

Also, a method in which the light diffusion/reflection effect of a protective member on the backside of a solar cell module is enhanced has been proposed (refer to Patent Document 2, for example).

Moreover, enhancing the light diffusion/reflection effect by using white color for a filler member 10 or a back surface protective member 11 is also generally practiced.

In addition, in order to obtain a solar cell module with high design quality, it is effective to form irregularities on the glass on the surface of the module and to form an antireflective film on the surface of the glass as mentioned above (refer to Patent Document 1, for example).

Furthermore, providing an anti-glare film inside the solar cell module so as to prevent reflection on the solar cell module and light pollution and suppress the gloss to a low level has been proposed (refer to Patent Document 3, for example).

[1] Japanese Unexamined Patent Publication No. 2003-124491
[2] Japanese Unexamined Patent Publication No. 2003-234484
[3] Japanese Unexamined Patent Publication No. 2001-203378

FIG. 16 illustrates an end portion of the light receiving surface of a conventional solar cell module, and FIG. 17 illustrates an end portion of the back surface of the same.

FIGS. 18 and 19 are cross-sectional views of the conventional solar cell module.

FIG. 18 is a cross-sectional view taken along the line G-G of FIGS. 16 and 17, and FIG. 19 is a cross-sectional view taken along the line H-H of FIGS. 16 and 17.

In each of the drawings, a solar cell element is denoted by X, a wiring member by 8, a connecting member by 6, a terminal box by 7 and a filler member by 10, respectively.

To connect solar cell elements together, electrodes on the surface are connected to electrodes on the back surface of another solar cell element by the wiring members.

To connect these wiring members 8 to the solar cell, usually, bus bar electrodes are formed in the regions of the solar cell elements where the wiring members 8 pass. In addition, a great number of narrow finger electrodes to be connected to the bus bar electrodes are formed to efficiently collect electric current from the surfaces of the solar cell elements.

A copper foil coated with solder is generally used for the wiring members 8, and they are fused to the bus bar electrodes on the surfaces of the solar cell elements. Since the connecting members 6 are also formed using a solder-coated copper foil as the wiring members 8, as shown in FIG. 16, the wiring members 8 and connecting members 6 with metallic gloss of solder are visible when the solar cell module is viewed from the light receiving surface side.

Meanwhile, the surfaces of the solar cell elements are roughened to improve the efficiency, and an antireflective film is formed to reduce the reflectance so as to effectively introduce the sun light. For this reason, the surfaces of the solar cell elements have a tone of color that is something between blue and dark blue near black.

Moreover, as mentioned above, in order to improve the properties of the solar cell module, the filler member 10 and the back surface protecting member 11 located on the back surface side of the solar cell elements are formed to have white color so as to enhance light diffusion/reflection effect, which is also a generally practiced method.

Accordingly, when the solar cell module is viewed from the light receiving side, the gaps between the solar cell elements have white color in many cases. This difference in color is one factor to deteriorate the design quality of the solar cell module.

In order to solve this problem, there have been proposals including coating the surfaces of the wiring members 8 and connecting members 6 with a colored resin layer (refer to Patent Document 4, for example), and providing a reflected light controlling film over the wiring members 8 to which the solar cell elements are connected (refer to Patent Document 5, for example) so as to make the wiring members 8 and the connecting members 6 less noticeable.

Also proposed is coloring the translucent panel 9 excluding regions that are opposed to the solar cell elements so as to prevent the wiring members 8, connecting members 6 and back surface material among the solar cell elements from being visible (refer to Patent Document 6, for example).

Furthermore, a technique for covering the connecting members 6 with a white sheet so that the connecting members 6 have the same color as that of the back surface material among the solar cell elements has been also devised.

[4] Japanese Unexamined Patent Application No. 2001-339089
[5] Japanese Unexamined Patent Application No. 10-323344
[6] Japanese Unexamined Patent Application No. 7-326789

When irregularities are formed in the glass on the surface of a solar cell module or an antireflective film is formed on the surface of the glass, the sun light is effectively introduced, and light pollution can be prevented. However, in such a case, the following problems arise: the cost for the glass material increases; large scale equipment is necessary for forming an antireflective film on the surface of the glass; and the production cost increases because the number of processes increases. In addition, when irregularities are formed on the surface of the glass, dirt and dust tend to adhere to the solar cell module that is set outside due to exposure to the elements, which intercept the sunlight before it enters the solar cell module, causing the solar cell module to have degraded output characteristics.

Similarly, in the case of a solar cell module provided with an anti-glare film inside thereof, although the problem of light pollution can be prevented, additional materials are required and the production cost increases. In addition, the effect to enhance light diffusion/reflection obtained by using white color for the filler member 10 or a back surface protective member 11 located on the back surface side of the solar cell elements of a solar cell module cannot be expected, which hinders improvement of the properties of the solar cell module.

Using the techniques such as covering the surfaces of the wiring members 8 and connecting members 6 with a colored resin layer, and providing a reflected light controlling film over the wiring members 8 connecting the solar cell elements makes it possible to make the wiring members 8 and connection members 6 less noticeable. However, since covering the surfaces of the wiring members 8 and connecting members 6 causes the problem of increase in material cost and the number of steps, and large scale equipment is required for forming a film on all of the solar cell elements connected through the wiring members 8, the production cost increases.

Using the technique of coloring the translucent panel 9 excluding regions that are opposed to the solar cell elements can prevent the wiring members 8, connecting members 6 and the back surface material seen among the solar cell elements from being visible. However, since this requires an additional step of coloring the translucent panel 9 and positioning between the translucent panel 9 that has predetermined, preliminarily colored regions and the solar cell elements connected through wiring members 8, the process becomes complicated. In addition, the effect to enhance light diffusion/reflection obtained by using white color for the filler member 10 or the back surface material 11 located on the back surface side of the solar cell elements cannot be expected, hindering improvement of the properties of the solar cell module.

As described so far, despite the high market demand, it has been difficult to realize the production of a solar cell module with high efficiency and high design quality at low cost.

The present invention has been made in consideration of the problems above, and an object of the present invention is to provide a solar cell module with high efficiency, high design quality, which is excellent in external appearance and can be produced at low cost.

DISCLOSURE OF THE INVENTION

A solar cell module according to the present invention comprises a translucent panel, a back surface protective member, a plurality of sheet-like solar cell elements that are arranged between the translucent panel and the back surface protective member and electrically connected to one another, and a filler member filling spaces among the solar cell elements, wherein a surface electrode is provided on light receiving surfaces of the solar cell elements, comprising three bus bar electrodes for retrieving light-produced electric current generated at the solar cell elements to the outside and finger electrodes for collecting electricity that are connected to the bus bar electrodes, and the bus bar electrodes have widths of not less than 0.5 mm and not more than 2 mm, and the finger electrodes have widths of not less than 0.05 mm and not more than 0.1 mm.

With this structure, while in the case of two bus bar electrodes, when the widths of the finger electrodes are narrowed for preventing light energy loss at the light receiving surfaces of the solar cell elements, the fill factor FF tends to deteriorate due to the series resistance component in the finger electrodes, providing three bus bar electrodes allows the lengths of the finger electrodes to be shortened, so that deterioration of the fill factor FF due to the series resistance component of the finger electrodes can be suppressed. A solar cell module with high output characteristics and high efficiency can therefore be obtained.

It is preferred that the foregoing solar cell elements each have a rectangular shape whose one side is not less than 100 mm and not more than 350 mm in length, and another side is not less than 100 mm and not more than 350 mm in length.

More preferably, the widths of the finger electrodes are not less than 0.05 mm and not more than 0.1 mm.

In addition, in the solar cell module according to the present invention, the finger electrodes are preferably in contact with the filler member. This prevents the finger electrodes from being exposed to moisture and oxygen, by which the long term reliability as well as the appearance of the solar cell module are improved.

Moreover, it is preferred that the solar cell module according to the present invention includes a diffusion layer of an opposite conductivity-type having a sheet resistance of at least 60Ω/□ and not more than 300Ω/□ formed on the light receiving surface side of the solar cell elements. When the sheet resistance is less than 60Ω/□, the short circuit current Isc is not improved, and when it exceeds 300Ω/□, it becomes difficult to form the opposite conductivity-type diffusion layer uniformly over the entire surfaces of the solar cell elements.

Furthermore, in the solar cell module according to the present invention, it is preferred that a great number of fine irregularities having widths and heights of not more than 2 μm and an aspect ratio of 0.1-2 are formed on the light receiving surface side of the solar cell elements. By providing such irregularities on the light receiving surface, the reflectivity can be reduced and the short circuit current in the solar cell elements can be improved.

According to the present invention, it is preferred that a trajectories drawn by moving edge lines of a contact surface between the bus bar electrodes and/or the finger electrodes (referred to as "surface electrode") and the semiconductor region continuously in the direction of the current flowing through the surface electrode include at least in a part thereof a region where the direction of a tangent line of the trajectories is not coincident with the electric current flowing direction.

More specifically, the edge lines of the contact surface between the surface electrode and the semiconductor region include a rugged contour.

According to this structure, a trajectory formed after a point at which a surface that is generally perpendicular to the direction of the current flowing in the surface electrode and an edge line of the surface electrode cross is moved continuously in the direction of the current includes at least in a part thereof a region where the direction of a tangent line of the trajectory is not coincident with the direction of the current. By this arrangement, as compared with when the edge line (an edge line of a contact area between the electrode and the semiconductor region) has a shape of a straight line, the length of the edge line is substantially increased. Accordingly, the substantial contact area between the surface electrode and the semiconductor region is increased, so that the contact resistance of the contact area between the both can be reduced effectively. The solar cell using such solar cell elements can therefore be highly efficient.

When the contact surface is formed by contact between the finger electrodes of the surface electrode and the semiconductor region, and an area of the contact surface between the finger electrodes and the semiconductor region is represented by $S_1$, an average value of distances between the edge lines of the contact surface within each cut surface formed by cutting at a plurality of cut planes that are generally perpendicular to the direction of the electric current flowing through the finger electrodes is represented by $d_1$, and an entire length of the edge line is represented by $L_1$, the solar cell elements preferably include at least one finger electrode where these $S_1$, $d_1$, and $L_1$ satisfy the following relationship:

$$0.5L_1(S_1 \cdot d_1^{-1}+d_1)^{-1}>1.2.$$

As described above, by the arrangement such that the foregoing formula is satisfied at the contact surface between the finger electrodes that mainly execute a power collecting function and the semiconductor substrate, the effective area of the contact surface can be distinctly increased to reduce the contact resistance. As a result, the output characteristics of the photoelectric elements can be improved.

It is preferable that the profile of the edge lines of the contact surface includes at least a part where the edge lines are asymmetric with respect to a center line of the finger electrode forming the contact surface that runs in the same direction as the direction of the current flowing through the finger electrode. Since this can eliminate parts where the width of the finger electrode is particularly small, the line resistance of the finger electrode will not be increased.

It is preferred that when the contact surface is formed by contact between the bus bar electrodes of the surface electrode and the semiconductor region, and with the contact surface being planarly viewed from a direction vertical to the light receiving surface, when an entire length of the edge lines is represented by $L_2$, an area of the contact surface is represented by $S_2$, and an area of the entire light receiving surface when planarly viewed from a direction vertical to the light receiving surface is represented by $S_3$, these $L_2$, $S_2$, and $S_3$ satisfy the following relationships:

$$L_2>5S_3^{1/2}$$

$$0.015<S_2/S_3<0.050$$

With the contact surfaces being planarly viewed, when the length of the edge lines $L_2$ is long, the regions (areas) into which electron currents of the bus bar electrodes flow in a concentrated manner can be extended (increased) and the contact resistance between the bus bar electrodes and the semiconductor region can be reduced, so that the conversion efficiency of the solar cell elements can be improved.

However, only increasing the sum $L_2$ of the entire lengths of the edge lines causes the bus bar electrodes to shield the light incident surface, which rather decreases the amount of incident light. Accordingly, it is determined that the proportion of the area $S_2$ defined when the edge lines of the contact surface are planarly viewed from a vertical direction to the area $S_3$ when the light receiving surface is planarly viewed is less than 0.050 (5%).

Meanwhile, the purpose of adding the term "planarly viewed" to the descriptions above is to ignore the irregularities and waves on the surfaces.

It is preferred that when an area of the bus bar electrodes and/or the finger electrodes planarly viewed from a direction vertical to the light receiving surface side is represented by Sa, and a surface area of a region of the light receiving surface of the solar cell element in which the surface electrode is provided is represented by Sb, the following relationship is satisfied:

$$1.10 \leq Sb/Sa \leq 2.10$$

This formula indicates that the ratio of the surface, area of the light receiving surface of the solar cell element in the region where the surface electrode is provided to the area of the surface electrode is 1.10 or more and 2.10 or less. This allows the substantial contact area between the surface electrode and the solar cell elements to be increased, and reduces adverse effect due to electrical loss caused by the series resistance component, so that the fill factor FF will not be deteriorated.

As a result of this, the solar cell element according to the present invention allows to reduce optical loss due to the surface electrode and improve the short circuit current density and fill factor in a properly balanced manner, so that good conversion efficiency can be achieved.

In addition, a solar cell module according to the present invention comprises a translucent panel, a back surface protective member, a plurality of sheet-like solar cell elements that are arranged between the translucent panel and the back surface protective member and electrically connected to one another, a plurality of wiring members for electrically interconnecting adjacent solar cell elements of the plurality of solar cell elements, and connecting members for electrically interconnecting the plurality of wiring members, wherein the connecting members are disposed between the back surfaces of the solar cell elements and the back surface protective member.

As described above, the connecting members interconnect the wiring members at locations between the solar cell elements and the back surface protective member, that is, at non-light-receiving locations. This structure makes it possible to reduce the area of the entire solar cell module. At the same time, it allows to prevent the formation of lines with different lengths between the wiring members and the solar cell elements, so that the design quality of the solar cell module can be further improved.

As described so far, the present invention makes it possible to obtain a solar cell module with high efficiency and high design quality through a simple process without causing the parts and steps to be increased. Thus, a solar cell module with high efficiency and high design quality exhibiting excellent appearance that can be produced at low cost can be realized.

Meanwhile, since the present invention exerts its advantageous effect particularly on solar cell modules in which the system's impression is determined by the external appearance, the present invention is particularly effective for large scale solar cell modules whose one side is about 1 m long or more. When the present invention is applied to such a module having a long side, not only high power generation efficiency can be achieved, but also the impression of the lines penetrating the solar cell module that are formed by spaces between the solar cell elements and the wiring members can be improved. As a result, a solar cell module with high design quality can be realized.

It is preferred that a sum of the areas of the plurality of solar cell elements accounts for not less than 91.9% and not more than 97.7% of an area on the light receiving surface side of the solar cell module. By determining the range as above, the packing density of the solar cell elements within the solar cell module can be increased with electrical connection between the solar cell elements being secured. It is therefore possible to render the impression of the color of the solar cell elements to the entire solar cell module, allowing the design quality of the solar cell elements to be improved, as well as to improve the power generation efficiency of the solar cell module (amount of power generation/area of solar cell module).

Preferably, the shorter distance selected from distances including the shortest distance between an end side of a solar cell element located at the outer most periphery of the plurality of arranged solar cell elements and an end of the perimeter of the solar cell module and the shortest distance between the wiring members or the connecting members and the end of the perimeter of the solar cell module is not less than 5 mm and not more than 11 mm.

This structure makes it possible to reduce the ratio of the outer peripheral region of the solar cell module that has a different color from that of the solar cell elements, and thereby to render a dark tone of the color of the surfaces of the solar cell elements, which is something between blue and dark blue near black, to the solar cell module. As a result, the design quality of the solar cell module can be further improved, as well as the power generation efficiency (amount of power generation/area of solar cell module) of the solar cell module can be improved owing to the high proportion of the solar cell elements.

The spacing between the plurality of solar cell elements is preferably not less than 70% and not more than 143% of the widths of the wiring members. This allows the spacings between the solar cell elements and the widths of the wiring members to be generally equal, which makes a plurality of lines in the same direction appear to be penetrating the solar cell module, as an overall impression of the solar cell module. Thus, the design quality of the solar cell module can be further improved.

By designing all the widths of the plurality of wiring members visible from the light receiving surface side to be generally identical, it is possible to prevent the wiring members from appearing to be uneven, thereby further improving the design quality of the solar cell module.

In addition, by determining the widths of the wiring members to be not less than 0.8 mm and not more than 2.0 mm, the wiring members can be prevented from being noticeable.

Moreover, a photovoltaic power generator according to the present invention is a device for extracting electric power by connecting one or a plurality of the solar cell modules.

BEST MODE FOR CARRYING OUT THE INVENTION

The solar cell module according to the present invention will be hereinafter described in detail with reference to the accompanying drawings.

Figure 1A:
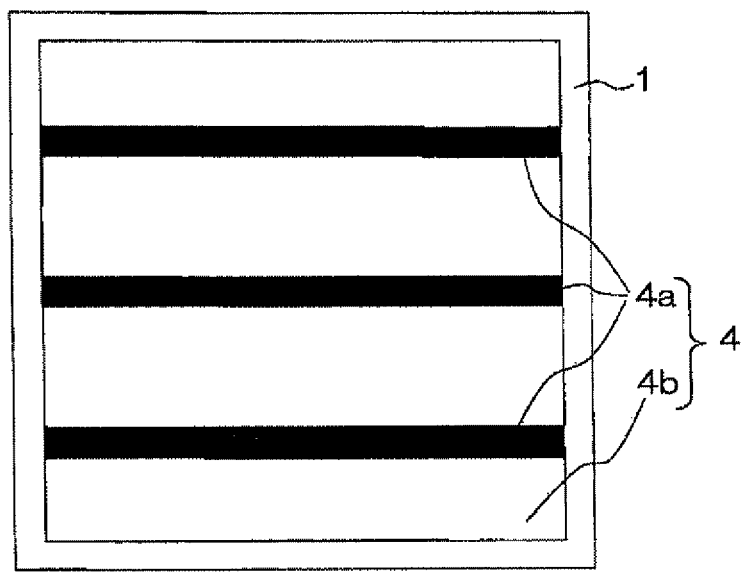
FIG. 1(a) illustrates a solar cell element used for a solar cell module according to the present invention viewed from the back surface thereof.
Figure 1B:
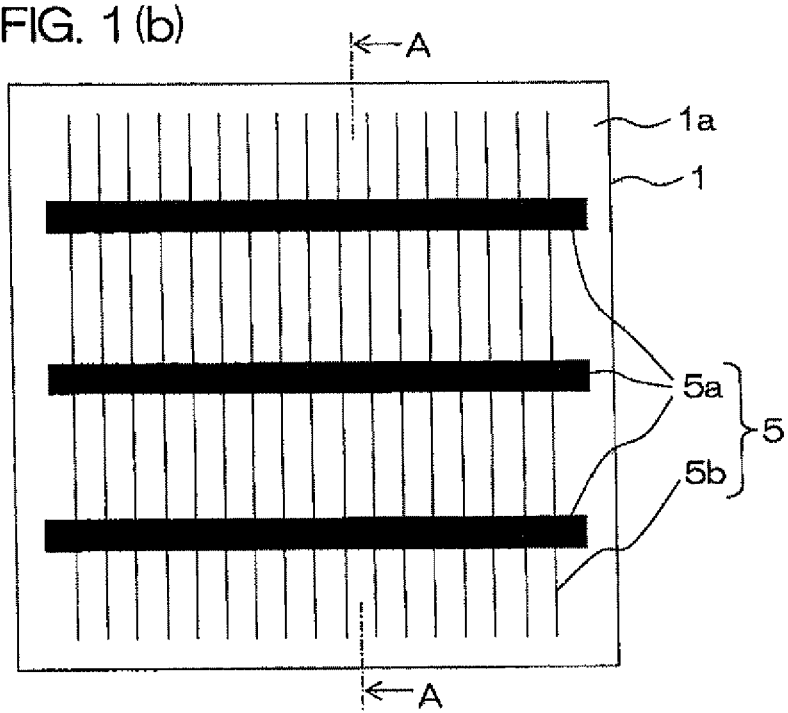
FIG. 1(b) illustrates the solar cell element used for a solar cell module according to the present invention viewed from the surface thereof.
Figure 2:
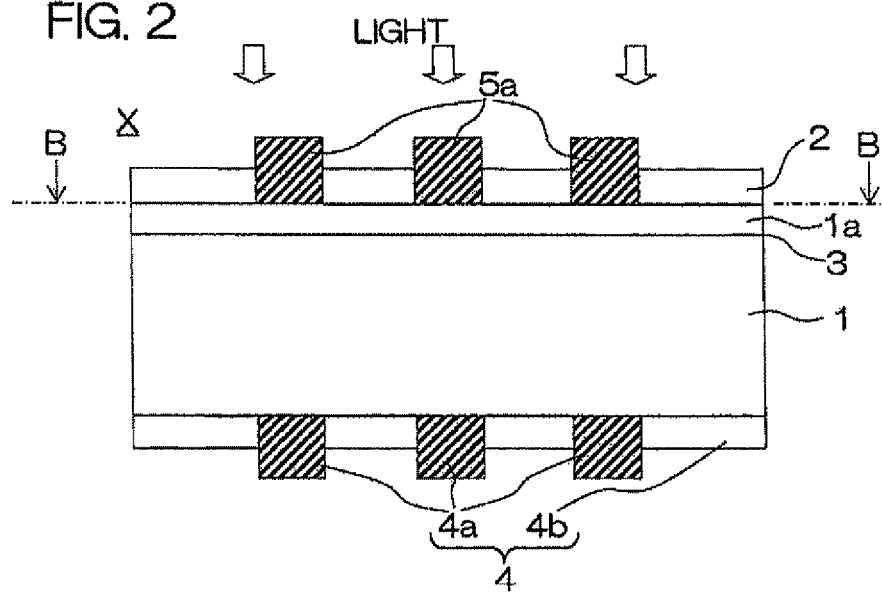
FIG. 2 illustrates a cross section of a solar cell element according to the present invention.

FIGS. 1(a) and 1(b) are cross-sectional views showing one example of the configuration of electrodes of a solar cell element. FIG. 1(a) shows the non-light-receiving surface (back surface) side, and FIG. 1(b) shows the light receiving surface (surface) side. FIG. 2 is a view of an A-A cross section showing a cross-sectional structure of the solar cell element.

A p-type silicon semiconductor substrate is denoted by 1, an n-type diffusion layer by 1a, an antireflective film by 2, a semiconductor junction region by 3, back surface bus bar electrodes by 4a, back surface power collecting electrode by 4b, surface finger electrodes by 5b, and surface bus bar electrodes by 5a.

The surface bus bar electrodes 5a and the surface finger electrodes 5b are collectively referred to as the "surface electrode". The back surface bus bar electrodes 4a and the back surface power collecting electrode 4b are collectively referred to as the "back surface electrode".

Now, a production process of the solar cell elements is described. First, a p-type semiconductor silicon substrate 1 comprising monocrystalline silicon, multicrystalline silicon, and the like is prepared. This silicon substrate 1 includes a semiconductor impurity such as boron (B) or the like in an amount of about $1\times10^{16}$-$1\times10^{18}$ atoms/cm$^3$ and has a specific resistivity of about 1.00-2.00 Ω·cm.

When a monocrystalline silicon substrate is prepared, it is formed by a pulling method or the like, and by a casting method or the like in the case of a multicrystalline silicon substrate. Multicrystalline silicon substrates can be mass-produced and advantageous in terms of production cost over monocrystalline silicon substrates. An ingot produced by the pulling, or the casting method is sliced into about 300 μm thick wafers, which are then cut to obtain a substrate 1 of 15 cm×15 cm in size.

Thereafter, the surfaces are etched to a small extent using hydrofluoric acid or hydrofluoric nitrate for cleaning the cut surfaces of the substrate.

Then, an irregular structure having a reflectance reducing function is formed on the surface side of the substrate, which is the surface where light is incident.

This reflectance reduction by means of irregularities is a very effective technique for increasing the short circuit current of the solar cell element. At this stage, if a great number of fine irregularities having widths and heights of not more than 2 μm where the aspect ratio is 0.1-2 are formed, in particular, the reflectance can be effectively reduced, and the conversion efficiency of the solar cell element can be improved.

While an anisotropic wet etching by means of an alkaline liquid such as NaOH, KOH used for removing a surface region of the substrate mentioned above may be adopted for the formation of this irregularity structure, since in the case of a multicrystalline silicon substrate formed by a casting method or the like, the crystal plane orientations randomly scatter from grain to grain within the substrate plane, it is very difficult to uniformly form a good irregularity structure capable of effectively reducing the light reflectance allover the substrate. In such a case, the formation of a good irregularity structure allover the substrate may be accomplished relatively easily by adopting gas etching by means of an RIE (Reactive Ion Etching) method or the like.

Subsequently, with the silicon substrate 1 situated in a diffusion furnace, a heat treatment is carried out in a gas including an impurity element such as phosphorous oxychloride (POCl$_3$). By this process, phosphorus atoms are diffused into a surface region of the silicon substrate 1 so that an n-type diffusion layer 1a with a sheet resistance of about 60-300Ω/□ is formed as an opposite conductivity-type region. The interface between the silicon semiconductor substrate 1 and the n-type diffusion layer 1a constitutes a semiconductor junction region 3. While the diffusion layer is formed to have a thickness of about 0.2-0.5 μm, it may be formed to have a desired thickness by controlling the diffusion temperature and time.

When the sheet resistance is less than 60Ω/□, the diffusion layer is too deep to improve the short circuit current sufficiently. On the other hand, when it is greater than 300Ω/□, the diffusion layer is so shallow that destruction of pn junctions may occur during the formation of electrodes in a later process, or adequate adhesion strength cannot be achieved between the substrate and the electrodes.

The method for forming the opposite conductivity-type region 1a is not limited to a thermal diffusion method, but for example, thin film deposition techniques and conditions thereof may be used to form a hydrogenated amorphous silicon film or a crystalline silicon film including a microcrystalline silicon layer at a substrate temperature of about 400° C. or below. However, when such films are formed using thin film deposition techniques, it is necessary to determine the order of the formation steps so that the process temperature becomes lower as the process proceeds, taking the respective process temperatures described below into consideration.

When the opposite conductivity-type region 1a is formed using a hydrogenated amorphous silicon film, it is formed to a thickness of 50 nm or less, preferably 20 nm or less, and when it is formed using a crystalline silicon film, the thickness is 500 nm or less, preferably 200 nm or less.

Incidentally, when the opposite conductivity-type region 1a is formed by the foregoing thin film deposition techniques, forming an i-type silicon region (not shown) between the p-type bulk region 5 and the opposite conductivity-type region 1a to a thickness of 20 nm or less is effective to improve the properties.

Then, with the n-type diffusion layer 1a remaining only on the surface side of the silicon substrate 1, the other portions are removed, and thereafter it is cleaned with pure water. The removal of the n-type diffusion layer 1a formed on regions other than the surface side of the silicon substrate 1 is carried out by applying a resist film on the surface side of the substrate 1, and then etching with a liquid mixture of hydrofluoric acid and nitric acid, and finally removing the resist film.

Subsequently, the antireflective film 2 is formed. As the antireflective film 2, $Si_3N_4$ film, $TiO_2$ film, $SiO_2$ film, MgO film, ITO film, $SnO_2$ film, ZnO film and the like may be employed. The thickness may be selected depending on the material used so as to satisfy a non-reflection condition to incident light (Let the index of refraction of the material be represented by n, and the wavelength in the spectrum range where non-reflection is desired be represented by λ, the optimum thickness of the antireflective film is expressed as (λ/n)/4=d.). For example, in the case of a generally used $Si_3N_4$ film (n=about 2), if the wavelength for non-reflection is 600 nm, the film thickness may be determined to be about 75 nm.

The antireflective film 2 is formed by a PECVD method, vapor deposition, sputtering or the like under a temperature of about 400-500° C. Meanwhile, the antireflective film 2 is patterned using a predetermined pattern for forming the surface electrode. The patterning process may be etching (wet or dry) using a resist as a mask, or forming a mask during the formation of the antireflective film 2 and removing the mask after the formation of the antireflective film 2.

As an alternative process, the so-called fire through process is also generally used, in which the electrode material is applied directly on the antireflective film 2 and baked thereby to bring the surface electrode into contact with the opposite conductivity-type region 1a. In this case, the foregoing patterning is not necessary. This $Si_3N_4$ film can be provided with a surface passivation effect during its formation process, and a bulk passivation effect during the following heat treatment process, which are combined with the antireflective function to contribute to improving the electrical characteristics of the solar cell element.

Then, with silver paste applied on the surface, and an aluminum paste applied on the back surface, the silicon substrate 1 is baked to form the surface electrode 5 and the back surface electrode 4.

As shown in FIG. 1(a), the back surface electrode 4 comprises back surface bus bar electrodes 4a and the back surface power collecting electrode 4b.

As shown in FIG. 1(b), the surface electrode 5 comprises the surface bus bar electrodes 5a for extracting outputs from the surface, and surface finger electrodes 5b for collecting power provided so as to perpendicularly cross the surface bus bar electrodes.

The back surface power collecting electrode 4b is deposited such that an organic vehicle and a glass frit are mixed with aluminum powder at a ratio of 10-30 parts by weight, and 0.1-5 parts by weight, respectively, per 100 parts by weight of aluminum to produce an aluminum paste, which is then printed, for example, by a screen printing method and dried. Thereafter, it is baked at a temperature of 600-800° C. for about 1-30 minutes. During this process, the aluminum diffuses into the silicon substrate 1 to form a back surface field layer that prevents carriers generated at the back surface from being recombined.

The back surface bus bar electrodes 4a, the surface bus bar electrodes 5a, and the surface finger electrodes 5b are deposited such that an organic vehicle and a glass frit are mixed with silver powder at a ratio of 10-30 parts by weight, and 0.1-5 parts by weight, respectively, per 100 parts by weight of silver to produce a silver paste, which is then printed, for example, by a screen printing method and dried. Thereafter, they are baked at a temperature of 600-800° C. for about 1-30 minutes at once.

Incidentally, the surface electrode 5 may be formed after the region of the antireflective film 2 that corresponds to the electrodes are removed by etching, or may be directly formed over the antireflective film 2 by a technique called fire through process.

Meanwhile, the solar cell element according to the present invention comprises three bus bar electrodes 5a. While in the case of two bus bar electrodes 5a, when the widths of the finger electrodes 5b are narrowed for preventing light energy loss on the light receiving surface of the solar cell element, the fill factor FF tends to deteriorate due to the series resistance component in the finger electrodes 5b, providing three bus bar electrodes 5a allows the lengths of the finger electrodes 5b to be shortened, so that deterioration of the fill factor FF due to the series resistance component of the finger electrodes 5b can be suppressed.

The foregoing bus bar electrodes 5a preferably have widths of not less than 0.5 mm and not more than 2 mm, and it is more preferable that the finger electrodes 5b have widths of not less than 0.05 mm and not more than 0.1 mm.

Widths of less than 0.5 mm are unpreferable for the bus bar electrodes 5a, because with such widths increases the resistance of the bus bar electrodes 5a, and the resistance of the wiring members 8 that are connected to the bus bar electrodes during the later process also increases. On the other hand, in the case of widths of more than 2 mm, although the resistance of the bus bar electrodes 5a can be decreased adequately, the electrodes become excessively thick that the electrode area of the surface electrode increases causing the light receiving surface area to be reduced, by which the conversion efficiency of the solar cell element may also unpreferably drop.

Widths of less than 0.05 mm are unpreferable for the finger electrodes 5b, because with such widths increases the resistance of the finger electrodes 5b. On the other hand, in the case of width of more than 0.1 mm, although the resistance of the finger electrodes 5b can be decreased adequately, the electrodes become excessively thick that the electrode area of the surface electrode increases causing the light receiving surface area to be reduced, by which the conversion efficiency of the solar cell element may also unpreferably drop.

While in the solar cell module according to the present invention described above, embodiments in which the electrode surface of the solar cell element is not covered with solder have been described, the electrode surface may be covered with solder.

The single solar cell element fabricated through the foregoing process can generate only a small amount of electric power. Therefore, it is necessary that a plurality of the solar cell elements are series and parallel connected to be assembled into a solar cell module so as to generate practical electric power.

As one example of the solar cell module, a cross-sectional view of a solar cell module Y constructed by combining the solar cell element X of FIG. 2 is shown in FIG. 3(*a*).

As shown in FIG. 3(*a*), a plurality of solar cell elements X are electrically interconnected through the wiring members 8, and disposed between the translucent panel 9 and the back surface protective member 11.

For the translucent panel 9, glass, a polycarbonate resin or the like is used. While clear glass, tempered glass, double-tempered glass, infrared-ray reflecting glass or the like may be used as the glass, generally, clear tempered glass with a thickness on the order of 3 mm-5 mm is commonly used. When polycarbonate resin is employed, those having a thickness on the order of 5 mm are commonly used.

For the filler member 10, materials with light transmittance, heat resistance, and electrical insulation are preferably used. Materials including ethylene vinyl acetate copolymer (EVA) containing 20-40% vinyl acetate or those including polyvinyl butyral (PV) as the main component in sheet-like forms, whose thicknesses are on the order of 0.4-1 mm are used. In many cases of solar cell module production, the filler member 10 is provided in both the surface side and back surface side of solar cell elements, and during the laminating process under decreased pressure, these are thermally crosslinked and fused to be integrated with other members.

For the back surface protective member 11, a fluorine-based resin sheet with weatherability including an aluminum foil held therein so as not to allow moisture to permeate, or a polyethylene terephthalate (PET) sheet including alumina or silica vapor deposited thereon or the like is used.

For the wiring members 8, a conductive material, for example, a material comprising a copper foil as the main body whose surface is coated with solder is used. This is cut to predetermined lengths, which are soldered to the bus bar electrodes 5a that extract power from the solar cell elements and the back side output electrodes 4a on the back side.

FIG. 3(*b*) is a partially enlarged view of the internal structure of the solar cell module Y in FIG. 3(*a*).

As shown in FIG. 3(*b*), a surface bus bar electrode 5a of a solar cell element X1 and a back surface bus bar electrode 4a of a solar cell element X2 adjacent thereto are connected to each other by three wiring members 8 (since this is a cross-sectional view, only one is shown in the Figure) so that a plurality of solar cell elements X are electrically connected to each other.

For the wiring members 8, for example, a copper foil with a thickness of about 100-300 μm whose surface is coated with about 20-70 μm thick solder is cut to predetermined lengths and used.

When the wiring members 8 are actually installed, first, one end of the wiring member 8 is soldered to a bus bar electrode 5a of a solar cell element by means of hot air or hot plate. Subsequently, the other end of the wiring member 8 is soldered in the same way to a back surface bus bar electrode 4a of a solar cell element that is adjacent to the foregoing one when arranged in a module. This procedure is repeatedly carried out to produce a group of solar cell elements including a plurality of solar cell elements connected to one another.

In the present invention, the bus bar electrodes 4a, 5a of the solar cell elements X are not preliminarily coated with solder, and the solar cell elements X and wiring members 8 are connected by fusing the solder that covers the wiring members 8.

Meanwhile, the effect of the present invention is exerted when at least one solar cell element according to the present invention is included in the group of solar cell elements. However, in order to exert the effect of the invention advantageously, it is more preferable that all the solar cell elements constituting the solar cell element group are the solar cell elements having the structure of the present invention.

Connection of the output wiring for extracting electric current collected by the wiring members 8 to the outside will be later described in detail with reference to FIG. 12-FIG. 15.

At this stage, a laminate including the foregoing translucent panel 9, surface side filler member 10, the group of solar cell elements including a plurality of solar cell elements to which the wiring members 8 and output wiring lines are connected, back surface side filler member 10 and the back surface protective member 11 are bonded and integrated.

That is, the laminate including each component is set in an apparatus called laminator for applying pressure to the laminate under decreased pressure while heating the same. Then, with the pressure being reduced to about 50-150 Pa to remove air inside the solar cell module, pressure is applied to the laminate at a temperature of 100-200° C. for 15 minutes to 1 hour while heating is maintained. By this process, the filler member 10 provided on both the surface side and the back surface side is softened, crosslinked and fused, so that the components can be bonded and integrated to produce a panel section of the solar cell module.

In addition, a terminal box is attached by an adhesive agent to the back surface of the panel section of the solar cell module that has been produced by the foregoing method. The structure of the terminal box will also be later described referring to FIGS. 12-15.

Usually, a module frame (not diagramed) is provided for the respective side regions of the panel section of a solar cell module. The module frame is fabricated by aluminum extrusion molding in many cases, and the surface is subjected to anodization. This module frame is fit to the respective sides of the panel section of the solar module, and the respective corner portions are fixed by means of screws or the like. Providing such a module frame gives mechanical strength and weatherability and furthermore, facilitates handling during the installation of the solar cell module and the like.

In the foregoing manner, a solar cell module according to the present invention is produced.

Now, the structure of the surface electrode of the solar cell element according to the present invention will be described in detail referring to the drawings.

FIG. 4(*a*) illustrates one example of the configuration of electrodes on the light incident surface side (light receiving surface side, surface side) of a solar cell element according to the present invention.

FIG. 4(*b*) is a partially enlarged view showing a cross section of the part C of FIG. 4(*a*) cut along the line B-B in FIG. 2.

As shown in FIG. 4(*b*), the area at which a finger electrode 5b and the semiconductor substrate 1 are in contact with each other is referred to as "contact surface 22a". Suppose the direction of a current flowing through the finger electrode 5b is denoted by "I", and the surface perpendicular to the current direction I is denoted by "J". At least a part of the trajectory (which corresponds to the edge line 22b in this example) of a cross point P at which the perpendicular surface J crosses an edge line 22b of the contact surface 22a that is formed when the point P is continuously moved along the current direction I has a rugged contour.

By providing a rugged contour in the edge lines 22b of the contact surface 22a as described above, the contact resistance between the finger electrode 5b and the semiconductor substrate 1 can be reduced.

Now, the reason for this is discussed.

Figure 5:
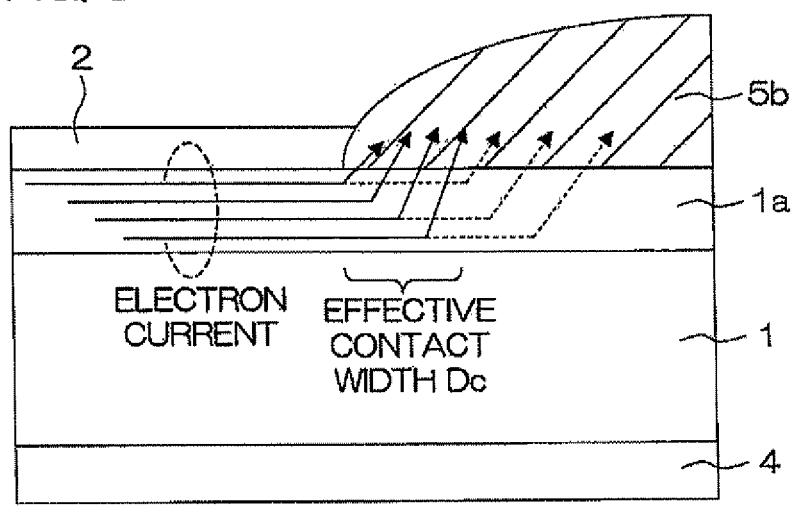
FIG. 5 schematically illustrates electric current flowing paths in a finger electrode (particularly its edge line part).

FIG. 5 is a cross-sectional view at the perpendicular surface 3' schematically illustrating current paths at an edge line region of a finger electrode 5b. In FIG. 5, 5b denotes a finger electrode, 1 denotes a p-type bulk semiconductor substrate, 1a denotes an opposite conductivity-type region, and the numeral 2 denotes an antireflective film.

In FIG. 5, electrons and holes generated mainly at the p-type bulk semiconductor substrate 1 are separated at a pn junction, so that electron carriers are collected in the opposite conductivity-type region 1a (hole carriers are collected on the p+ region side of the back surface of the p-type bulk semiconductor substrate 1, which is not shown), and these collected electron carriers flow laterally (in the direction horizontal to the substrate plane) into the finger electrode 5b as electron currents, the manner of which is indicated by arrows.

As shown in FIG. 5, the electron currents tend to flow into the vicinity of the edge line of the finger electrode 5b in a concentrated manner. The degree of this concentration is determined depending on a magnitude relationship between the sheet resistance of the opposite conductivity-type region 1a and the contact resistance between the surface electrode and the opposite conductivity-type region 1a.

That is, suppose arbitrary electric current paths that differ from each other in the position at which electrons flow from the opposite conductivity-type region 1a into the finger electrode 5b (the position at which electrons transverse the interface between the both), and the total resistance of the current paths is discussed.

If a resistance originated from the contact resistance is sufficiently small as compared with a resistance originated from the sheet resistance (normally, this condition is satisfied), an electric current flows selectively through a path with the smallest resistance loss. For this reason, electron currents flow into an edge line region of the finger electrode 5b as shown in FIG. 5. If the proportion of a resistance originated from the contact resistance to the total resistance of the paths is extremely large (e.g. in a rare case where a cell is defective and has poor contact characteristics), the degree of concentration of electron currents flowing into an edge line region is lowered, and electron currents flow over a wider contact range (shown by dotted lines in FIG. 5).

Figure 4A:
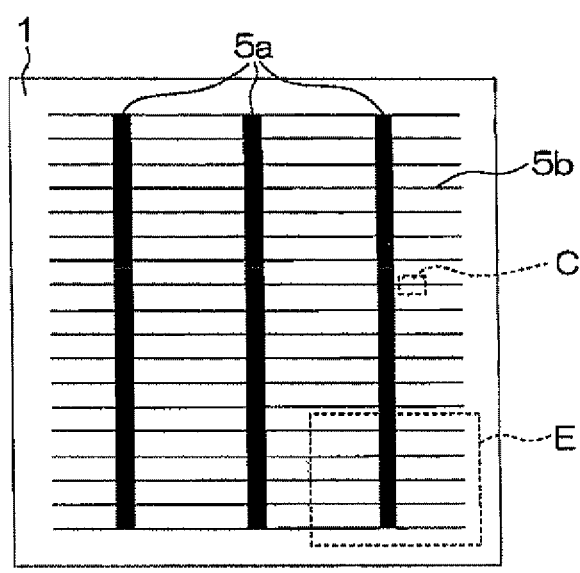
FIG. 4(a) shows an example of the configuration of electrodes on the light receiving side (surface side) of a solar cell element.
Figure 4B:
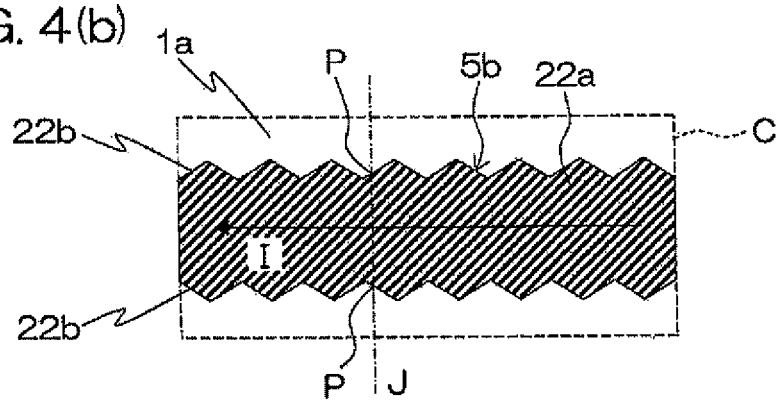
FIG. 4(b) is a partially enlarged view showing a cross section of the part C of FIG. 4(a) cut along the line B-B of FIG. 2.

In the present invention, at least a part of the foregoing trajectory (edge line 22b) comprises a rugged contour as shown in FIG. 4(b). Owing to this structure, it is possible to substantially expand the region of the edge line of the finger electrode 5b into which electron currents flow in a concentrated manner. As a result, the contact resistance between the surface electrode and the semiconductor substrate 1 can be reduced.

Referring to the case related to the present invention where normal contact characteristics are achieved, contact resistance Rc [Ω] can be expressed using surface contact resistance Rcs [Ω·cm$^2$] and contact area Sc [cm$^2$] as follows:

$$Rc = Rcs/Sc$$

Here, if the contact area Sc is expressed using contact width Wc (the direction perpendicular to the sheet surface in FIG. 5) and contact depth Dc (the direction from the contact edge line toward the inside of the finger electrode 5b, and horizontal to the sheet surface in FIG. 5) as Sc=Wc×Dc, the equation above can be expressed as follows:

$$Rc = Rcs/(Wc \times Dc)$$

where Dc corresponds to the effective contact width in FIG. 5.

Therefore, when Wc is increased, Rc can be reduced, and this Wc can be effectively increased by the present invention.

Meanwhile, generally, finding the value of Dc is very difficult. In this case, it is convenient to discuss this using Rc×Dc instead of Rc on the basis of the unit [Ω·cm]. This is because in this way, a magnitude comparison between values proportional to Rc can be discussed based only upon the measurable Rcs and Wc (Rcs can be easily measured by the four-point probe method).

According to this, in a conventional structure in which the foregoing trajectory (edge line 22b) is not provided with a rugged contour, the value of Rc×Dc can be estimated to be about 2-4 Ω·cm. When this value is converted into conversion efficiency with respect to a solar cell element using a multi-crystalline silicon substrate with a conversion efficiency on the order of 15% that is used for crystalline silicon based modules currently available in the market, this can be assumed to be a loss of about 0.2-0.3%.

Contrary to this, in the structure according to the present invention where the foregoing trajectory (edge line 22b) includes a rugged contour, the resistance of the contact surface can be relatively easily reduced by around 50% in this Rc×Dc, which corresponds to an improvement of 0.1-0.15% over the conventional structure when converted into conversion efficiency.

In the solar cell element according to the present invention, the pattern of the surface electrode is arranged, as already shown in FIG. 4(b), such that a point P at which an opposite conductivity-type region 1a and an edge line 22b of a contact surface 22a of a power collecting electrode cross a surface J that is generally perpendicular to a current direction I forms a trajectory extending in I direction that comprises at least in a part thereof a rugged contour.

In order to realize such an edge line 22b, specifically, when a printing and baking process using paste is employed, it can be deposited by screen printing with use of a screen having a predetermined aperture pattern designed so that the edge lines 22b of the contact surface 22a have zigzags as shown in FIG. 4(b) followed by baking as described above. By this, the effective length of the edge lines 22b of the contact surface 22a of the collecting electrode is increased, and the substantial contact area with the opposite conductivity-type region is also increased, so that the contact resistance can be reduced effectively.

Lastly, a solder region (not shown) is formed on the surface electrode and the back surface electrode by a solder dipping process. Meanwhile, when electrodes are formed as solderless electrodes without using solder, the solder dipping process is omitted.

Figure 6A:
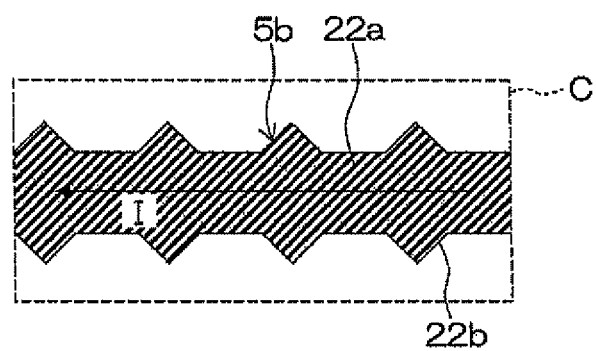
FIGS. 6(a), 6(b) illustrate embodiments of a contact surface according to the present invention.
Figure 6B:
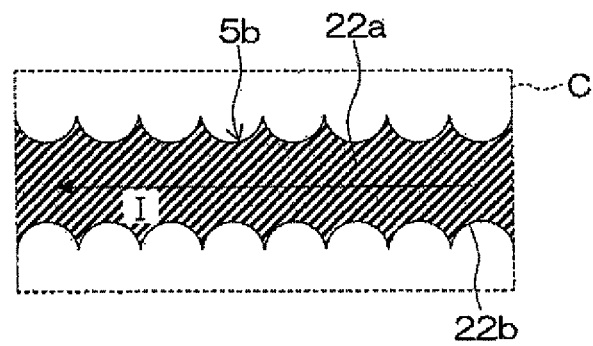

Incidentally, while in the embodiment shown in FIG. 4(b), the configuration of the rugged contour provided in the edge lines 22b of the contact surface 22a between the surface electrode and semiconductor substrate 1 is in zigzags as that of triangular waves formed like a continuous row of triangles, it may be, for example as shown in FIG. 6(a), formed like triangles appearing intermittently in the edge lines 22b, or may be formed by curves as shown in FIG. 6(b). In this way, the edge lines 22b can be formed by polygons, rectangles, curves or combinations thereof.

In addition, it is more preferable that the configuration of the edge lines of the contact surface 22a is asymmetric with respect to the center line of the surface electrode forming the contact surface 22a (the center line in the same direction as the current direction I of the surface electrode).

Figure 7A:
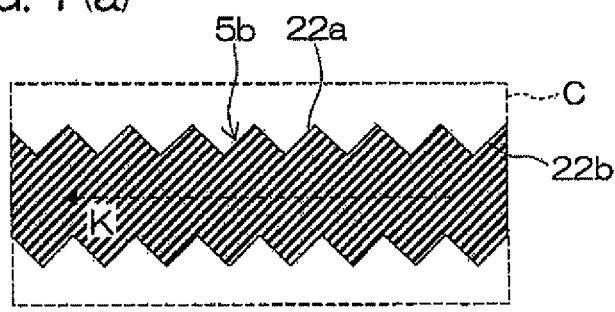
FIGS. 7(a), 7(b) and 7(c) illustrate other embodiments of a contact surface according to the present invention.
Figure 7B:
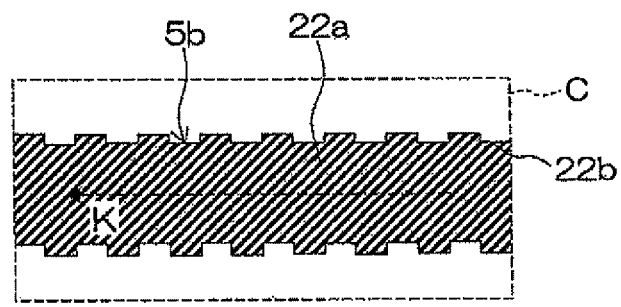
Figure 7C:
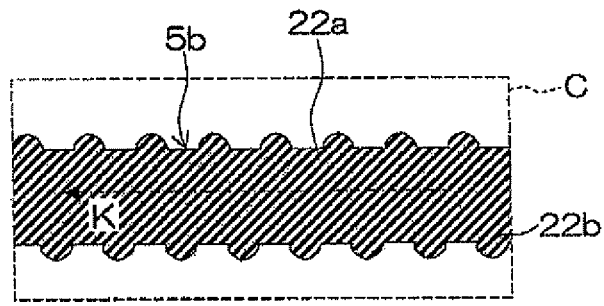

FIGS. 7(a)-7(c) illustrate configurations of the contact surface 22a between the finger electrode 5b and the semiconductor substrate 1 and its edge lines 22b.

In FIG. 7(a), the edge lines 22b opposed to each other with respect to a center line K are formed in zigzags with a phase difference. In other words, the lines have an asymmetric positional relationship. Since this arrangement enables to eliminate parts where the width of the finger electrode 5b is particularly small, the line resistance of the finger electrode 5b is not increased, which is very effective.

As shown in FIGS. 7(b) and 7(c), the configuration of the edge lines 22b is not limited to a zigzag form, but may include polygons, rectangles, curves or combinations thereof, which are arranged so that the edge lines are asymmetric with respect to the electric current flowing direction.

While FIGS. 7(a)-7(c) show embodiments in which the phase difference between the contours of the edge lines that are asymmetric with respect to the center line of the finger electrode 5b is a half cycle (n), the phase difference is not limited to a half cycle. It may be any other form as long as narrow portions of the finger electrode 5b can be reduced.

Figure 8:
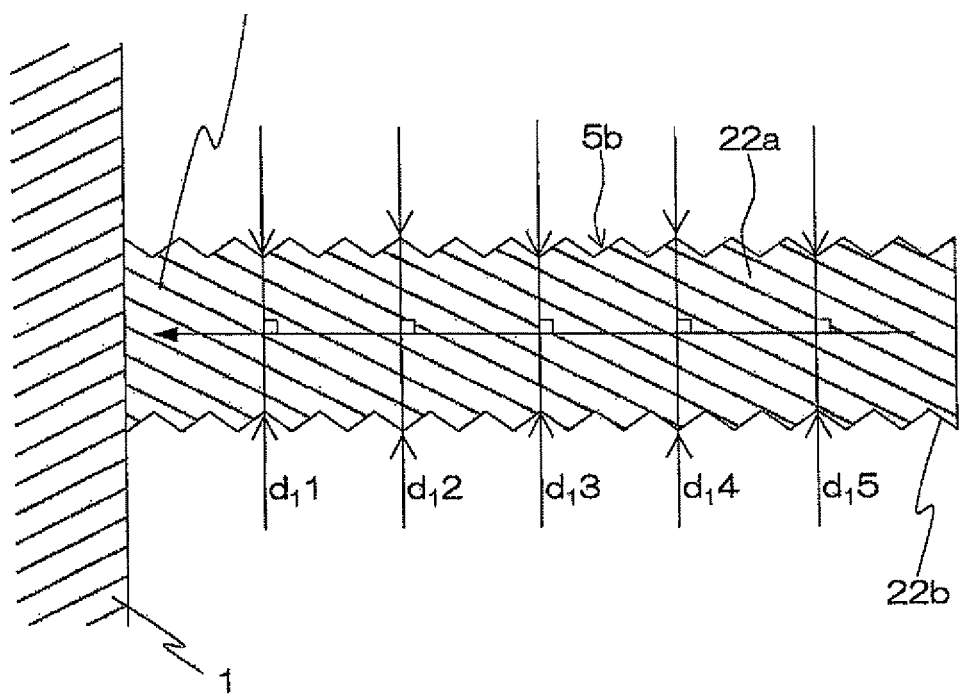
FIG. 8 is a diagram for illustrating a preferred mode of dimensional design of a finger electrode according to the present invention.

As shown in FIG. 8, when the area surrounded by the edge lines 22b of the contact surface 22a formed by the finger electrode 5b and the semiconductor substrate 1 being in contact with each other is represented by S1, an average value of distances between the edge lines within each cut surface formed by cutting at a plurality of cut planes that are generally perpendicular to the direction of electric current flowing through the finger electrode I is represented by $d_1$, and the perimeter of the edge lines 22b is represented by L1, it is preferable that these $S_1$, $d_1$, $L_1$ satisfy the following relationship:

$$L_1/2(S_1 \cdot d_1^{-1} + d_1) > 1.2 \qquad (1)$$

Now, what the formula (1) indicates will be described. The area $S_1$ surrounded by the edge lines 2b of the contact surface 22a formed by the finger electrode 5b and the semiconductor substrate 1 being in contact with each other can be also described as the area observed when the edge lines of the contact area 22a are planarly viewed from a vertical direction.

Accordingly, suppose that the shape of the finger electrode 5b is rectangular, $2(S_1 \cdot d_1^{-1} + d_1)$ is equal to the perimeter of the rectangular shape. Therefore, $L_1$ divided by this gives:

$$R = 0.5 L_1 (S_1 \cdot d_1^{-1} + d_1)^{-1}$$

which represents the ratio between the perimeter of the edge lines 22b (with a rugged contour) of the contact surface 22a and the perimeter without a rugged contour (in the case of a rectangular shape). This can therefore be an index indicating the degree of the rugged contour of the edge lines 22b.

As described above, by defining the perimeter $L_1$ of the edge lines 22b of the contact surface 22a between the finger electrode 5b, which, in particular, functions mainly as a collecting electrode in the surface electrode and the semiconductor substrate 1 to be 1.2 or more times as large as the perimeter of edge lines forming a rectangular shape with the same area, it is possible to distinctly increase the effective area of the contact surface 22a and thereby to reduce the contact resistance. The output characteristics of the photoelectric conversion element can therefore be improved.

Meanwhile, the upper limit of the foregoing proportion is preferably 3-5, or more preferably 3.

$$R < 3-5$$

That is, in cases where the rugged structure of the surface of the semiconductor region is negligibly small and the edge lines 22b form a two-dimensional structure, if the foregoing proportion exceeds the upper limit, the line width at recessed portions of the rugged contour is bound to be too small that problems such as line breakage arise.

Also, in cases where the edge lines 22b are formed to have a three-dimensional structure reflecting the rugged structure of the surface of the semiconductor region under the surface electrode, if the foregoing proportion exceeds the upper limit, the aspect ratio (height/pitch of rugged portion) of the rugged structure of the surface of the semiconductor is too great that leak tends to occur at the projected portions of the rugged structure.

In the above stated range of 1.2-3-5, these are well balanced, so that the effect of the invention will be advantageously exerted.

The measurement of the width of the finger electrode 5b may be carried out by dividing the finger electrode 5b into m (m≥6) equal parts along the longitudinal direction and determining the average thereof. For example, in the case of FIG. 8, the finger electrode 5b is equally divided into 6 parts at five points including $d_1 1 - d_1 5$. The average of values at these five locations may be determined as $d_1$.

$$d_1 = \Sigma d1i/n \; (i=1,2,\ldots n)$$

Meanwhile, the foregoing description is given by referring to a structure including the finger electrode 5b as surface electrode that forms the contact surfaces 22a by being in contact with the semiconductor substrate 1, and the bus bar electrode 5a for extracting power that is connected to at least one end of the finger electrode 5b and has a larger line width than the finger electrode 5b.

However, the element that forms a contact surface by being in contact with the semiconductor region as surface electrode is not limited to finger electrodes. It is preferable that bus bar electrodes are also arranged so as to form the contact surfaces according to the present invention by being in contact with the semiconductor region, which exerts more advantageous effect.

Hereinafter, preferred structures of bus bar electrode 5b according to the present invention will be described with reference to FIGS. 9(a), 9(b).

Figure 9A:
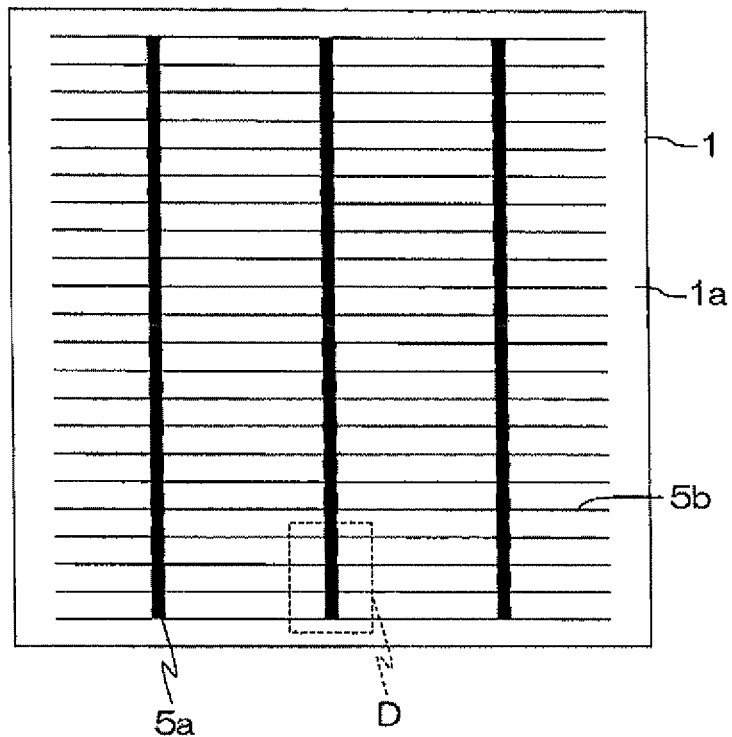
FIG. 9(a) is a diagram for illustrating a preferred mode of dimensional design of bus bar electrodes according to the present invention.

FIG. 9(a) illustrates a surface electrode viewed from the light incident surface side of a solar cell element according to the present invention. FIG. 9(b) is an enlarged view of a part D of FIG. 9(a).

Figure 9B:
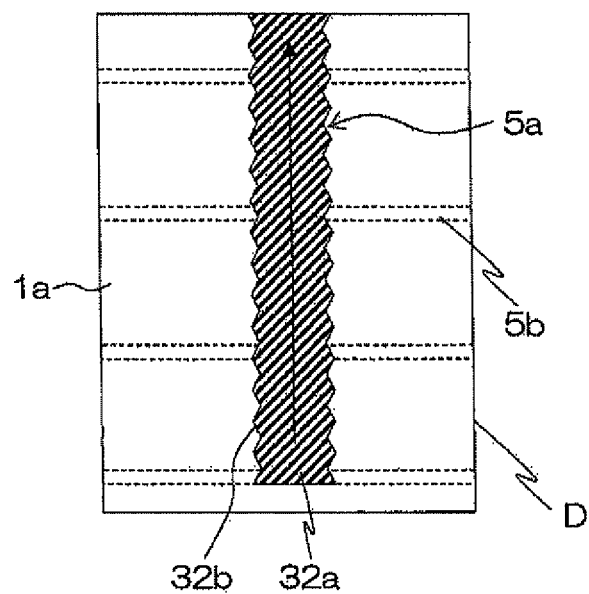
FIG. 9(b) is an enlarged view of the part D of FIG. 9(a).

As shown in FIG. 9(b), referring to a contact surface 32a that is formed by a bus bar electrode 5a and a semiconductor substrate 1 (a cross-sectional structure thereof is shown in FIG. 2) being in contact with each other, when the sum of the entire lengths of the edge lines 32b is represented by $L_2$, the area of the contact surface 32a when the edge lines 32b are planarly viewed from a direction vertical to the light incident surface is represented by $S_2$, and the area of the entire light incident surface planarly viewed from a direction vertical to the light incident surface is represented by $S_3$, it is preferable that these satisfy the following formulae:

$$L_2 > 5\sqrt{S_3} \qquad (2)$$

$$0.015 < S_2/S_3 < 0.050 \qquad (3)$$

First, a description will be given to formula (2).

This indicates, as shown in FIG. 9(b), that the sum of the entire lengths $L_2$ of the edge lines 32b when the contact surface 32a is planarly viewed is 5 times or more the square root (½th power) of the area $S_3$ of the entire light incident surface of the solar cell element when planarly viewed.

The example shown in FIG. 9(b) is an enlarged view of apart of the bus bar electrode 5a. The actual entire length of the edge line 32b covers the entire length of the bus bar electrode 5a, and to obtain the sum $L_2$ of the entire lengths of the edge lines 32b, as many additions as the number of the bus bar electrodes 32b are necessary.

In the present invention, the length of the edge lines 32b is long when the contact surface 32a is planarly viewed, which corresponds to substantially expanding (increasing) the region (area) of the edge line portions of the bus bar electrode 5a into which electron currents flow in a concentrated manner. This is the same as already speculated referring to FIG. 5. As a result of this, the contact resistance between the bus bar electrodes 5a and semiconductor substrate 1 can be reduced, so that the conversion efficiency of the solar cell element can be increased.

The sum $L_2$ of the entire lengths of the edge lines 32b is preferably 5 times or more the square root (½th power) of the area $S_3$ of the entire light incident surface of the solar cell element. This condition can be satisfied as long as the number of the bus bar electrodes 5a is three or more when the solar cell element has a generally square shape and includes bus bar electrodes 5a each of which has a length slightly shorter than the length of one side of the solar cell element as shown in FIG. 9(a).

However, only increasing the sum $L_2$ of the entire lengths of the edge lines 32b causes the bus bar electrodes 5a to shield the light incident surface, leading to decrease in the amount of incident light.

Accordingly, it is preferred that, as the formula (3) indicates, the proportion of the area $S_2$ defined when the edge lines 32b of the contact surface 32a are planarly viewed from a vertical direction to the area $S_3$ of the light incident surface is less than 0.050 (5%).

By the way, the purpose for adding the limitation as "planarly viewed" to the descriptions above is to exclude the irregularities and waves on the surfaces.

The foregoing area $S_2$ corresponds to the area of the bus bar electrodes 5a. By suppressing the proportion of this area to be smaller than a prescribed range with respect to the entire area of the light incident surface, decrease of the conversion efficiency can be suppressed. Meanwhile, if the proportion is 0.015 (1.5%) or less, the widths of the bus bar electrodes 5a become narrower, and for this and other causes, the conduction resistance increases, which is therefore unpreferable.

The operational effect of the foregoing formulae are advantageously exerted even when the shape of the solar cell element is irregular.

Figure 10A:
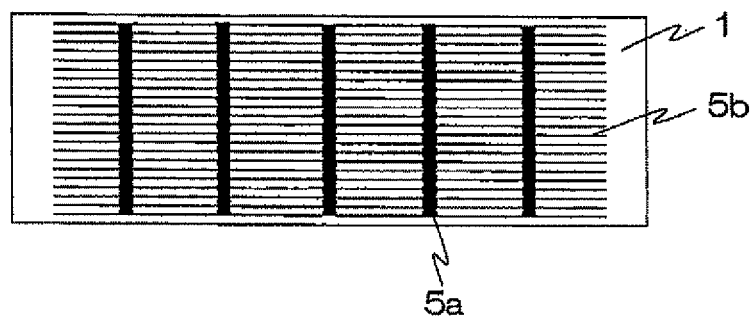
FIGS. 10(a), 10(b) illustrate bus bar electrodes according to the present invention in a solar cell element with an irregular shape.
Figure 10B:
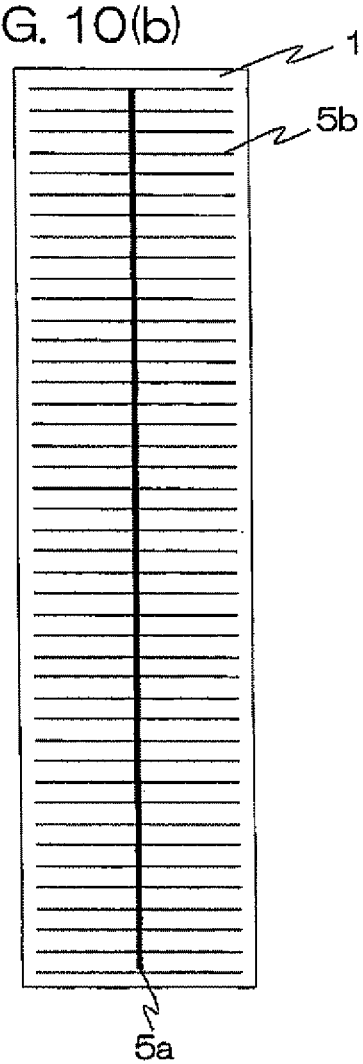

FIGS. 10(a), 10(b) illustrate examples of solar cell elements with irregular shapes. FIG. 10(a) shows a horizontally long solar cell element including finger electrodes 5b in the longitudinal direction, and five bus bar electrodes 5a in the shorter axis direction, and FIG. 10(b) shows a vertically long solar cell element including one bus bar electrode 5a in the longitudinal direction, and finger electrodes 5b in the shorter axis direction.

For example, in the case of the example of FIG. 10(a), although the length of each bus bar electrode 5a is short, the number of the bus bar electrodes 5a is increased in this structure based on formula (2). In such a horizontally long solar cell element, the lengths of the finger electrodes 5b tend to be long, causing the resistance to increase, which adversely affects the characteristics of the solar cell element. However, by increasing the number of the bus bar electrodes 5a as indicated by formula (2), the distance from the finger electrodes 5b to the bus bar electrodes 5a can be shortened, so that it is possible to avoid adverse influences due to increased resistance.

In the case of the example of FIG. 10(b), since the length of each bus bar electrode 5a is long, the number of bus bar electrodes 5a may be decreased according to formula (2) in this structure. In such a vertically long solar cell element, since the length of the finger electrodes 5b are shortened, even when the number of the bus bar electrodes 5a is small, the possibility of adverse influences due to the resistance of the finger electrodes 5b is small.

As described so far, the lengths and areas of the bus bar electrodes according to the present invention can be optimized by arrangements based on formulae (2) and (3). The solar cell element according to the present invention can therefore achieve a good conversion efficiency.

Meanwhile, when the semiconductor substrate 1 is provided with numerous fine irregularities by gas etching such as the RIE method, actual lengths of the edge lines 32b are substantially longer than the lengths of the edge lines 32b observed when the contact surface 32a is planarly viewed, so that a higher effect can be obtained.

While the foregoing description has been made referring to the examples where end portions of finger electrodes 5b are connected to bus bar electrodes 5a for extracting power generally perpendicularly thereto, the connection may be accomplished in other ways than orthogonal crossing, and the structure may be such that both end portions of one finger electrode are connected to a bus bar electrode 5a to form a closed configuration. In addition, while in the foregoing examples, as the edge lines 22b on the both sides of the contact surface 22a of finger electrode 5b, edge lines that are homotheically similar contours are described, however, the contours may not be necessarily homotheic to each other.

Furthermore, the surface electrodes have generally linear shapes are described in the foregoing description, they may have generally curved shapes. While examples where the semiconductor substrate is flat (when the structure of edge lines 22b is two-dimensional) have been described above, the configuration is not limited to this, but the surface of the semiconductor substrate may have irregularities (such as a pyramidal structure formed by alkaline etching, or a finely roughened structure formed by the RIE process), or may have a curved (e.g. spherical) configuration (in other words, when the edge lines 22b have a three dimensional structure). In any case, it is needless to say that the same effect can be obtained according to the principles and structure of the present invention. In these cases, the current flowing direction and the contact surface 22a themselves are in the form of a generally curved line or a curved surface according to the shape of the electrodes. A direction generally perpendicular to the current flowing direction may be determined to be the direction perpendicular to the normal line at the desired portion in a curved line indicating the current flowing direction.

In addition, while the foregoing description has been made referring to examples where the solar cell element according to the present invention includes a trajectory (which corresponds to the edge line 32b in the foregoing example) that includes a rugged contour in at least a part thereof, also when the structure is arranged such that at least a part of the trajectory includes a region where the direction of the tangent line thereto is not coincident with the current direction, the effect of the present invention is exerted. The region where the direction of the tangent line and the current direction are not coincident includes, for example, in the case of a configuration with a rugged contour, transition regions from a recess to a projection, or a projection to a recess.

Now, the structure of the contact surface between the surface electrode and semiconductor substrate will be described referring to FIGS. 11(a) and 11(b).

Figure 11A:
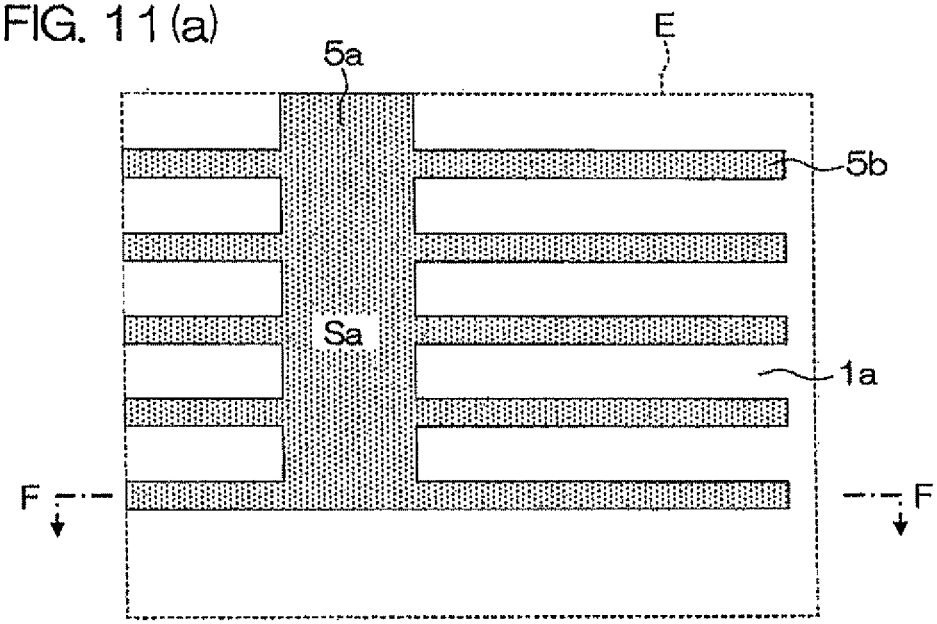
FIG. 11(a) is an enlarged view of the part E of FIG. 4(a) showing one example of the configuration of electrodes on the light receiving surface side (surface side) of a solar cell element according to the present invention.
Figure 11B:
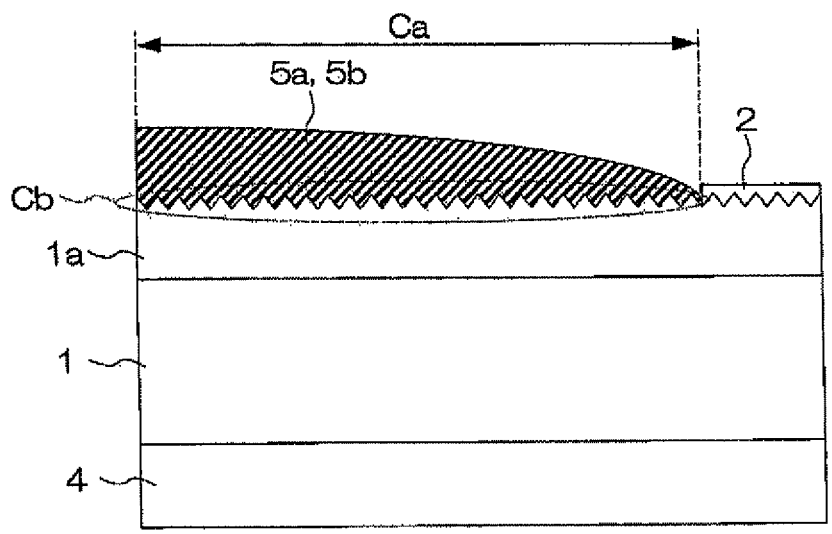
FIG. 11(b) is a partially enlarged view showing a cross section cut along the line F-F of FIG. 11(a).

FIG. 11(a) is an enlarged view of the part E of the surface electrode shown in FIG. 4(a), and FIG. 11(b) is a partially enlarged cross-sectional view of the surface electrode in FIG. 11(a) cut along the line F-F.

As FIG. 11(a) shows, an area defined when bus bar electrodes 5a and finger electrodes 5b constituting the surface electrode are planarly viewed from a vertical direction on the light receiving surface side is denoted by Sa.

Meanwhile, the area Sa of the surface electrode can be determined such that the solar cell element is photographed from a vertical direction on the light receiving surface side, and the surface image is digitized, which is thereafter converted into a binary form using a threshold value for separating the surface electrode from areas other than this by a known image processing method, thereby separating the area of the surface electrode from areas other than it, so that the area can be determined.

In addition, as shown in FIG. 11(a), the invisible surface area of regions that are covered with the surface electrode, in other words, the surface area of regions immediately under the regions in which the surface electrode (bus bar electrodes 5a and finger electrodes 5b) is provided is denoted by Sb.

The surface area Sb in the light receiving surface of this solar cell element may be measured by removing the surface electrode using a predetermined acid (for example, aqua regia for the electrodes mainly including silver) that is selected according to the kind of the material for the surface electrode, and thereafter measuring the surface area of the region in which the surface electrode has been provided. For measurements of the surface area, either of contact type or noncontact type may be used, an AFM (atomic force microscope) may preferably be used in view of accuracy. Meanwhile, when AFM is used, since its observable area is limited, it is preferred to measure at a plurality of locations in the predetermined regions in which the surface electrode is provided, and to process data statistically.

Here, the relationship between Sa and Sb satisfies the following formula (4):

$$1.10 \leq Sb/Sa \leq 2.10 \quad (4)$$

Now, an explanation of formula (4) will be given. As described above, since the denominator Sa represents the area of surface electrode, and numerator Sb represents the surface area of the light receiving surface of a solar cell element in the region in which the surface electrode is provided, Sa/Sb in formula (4) serves as an index of the proportion of the surface electrode in contact with the light receiving surface of a solar cell element.

To help understanding of this, a cross-sectional view is shown in FIG. 11(b). Since Sa is the area of the surface electrode when viewed planarly, it is expressed as a one-dimensional linear form in FIG. 11(b) as indicated by a double-headed arrow Ca, and Sb is expressed as a two-dimensional irregular form enclosed by a region Cb. However, actually, these are extended also in the depth direction of FIG. 11(b), Sa is a two-dimensional (virtual) planar surface, and Sb is a surface with three-dimensional irregularities.

Here, by determining the surface area of the light receiving surface of the solar cell element so that the proportion in this formula is in the range of not less than 1.10 and not more than 2.10, it is possible to increase substantial contact area between the surface electrode and the solar cell element.

Meanwhile, when Sb/Sa is less than 1.10, a problem that hinders improvement in conversion efficiency of the solar cell element may arise, that is, increasing the contact area for improving an FF (Fill Factor) leads to an decrease of the light receiving area to decrease the short circuit current, and reducing the electrode area for improving the short circuit current leads to a decrease of the FF. When Sb/Sa is greater than 2.10, it becomes hard to fill over a surface of a silicon substrate with an electrode material by the screen printing method.

As described so far, with the structure of the solar cell element according to the present invention, the substantial contact area between the surface electrode and the solar cell element is increased to be an appropriate value, which enables to reduce adverse influences due to the series resistance component. For this reason, the fill factor FF is not be deteriorated.

As a result of this, the solar cell element according to the present invention is capable of reducing optical loss due to the surface electrode, and improving the short circuit current density and the fill factor while keeping a proper balance therebetween, so that good conversion efficiency can be achieved.

Incidentally, in order to reduce the value of Sb/Sa in formula (4), measures such as making the surface of the semiconductor substrate under the electrodes near flat or interposing an insulating film between the electrodes and the semiconductor substrate may be taken. On the other hand, in order to increase it, the surface of the semiconductor substrate under the electrodes may be roughened, or formed with recesses.

In particular, to realize the proper range of the present invention, it is preferable that the surface of the semiconductor substrate under the electrodes has a roughened form. In addition, when the electrodes are formed by screen printing, it is preferable to form fine irregularities whose heights are 2 μm or less uniformly. This makes it possible to fill along the profile of the semiconductor substrate with the electrode material, so that the series resistance can be more effectively reduced.

The foregoing area Sa of the surface electrode according to the present invention viewed planarly is preferably 4%-7% with respect to the light receiving surface of the solar cell element, because at such proportions, light energy loss can be optimally suppressed and influences of the resistance component of the electrodes can be less likely exerted.

In addition, in the solar cell element according to the present invention, it is preferred that a short cut current density Jsc, determined by dividing short circuit current Isc defined by JIS C 8913 (1998) by the area of the substrate, is 35.5 mA/cm2 or more, and an FF defined by JIS C 8913 (1998) is 0.75 or more. Designing the electrodes for a solar cell element with such high short circuit current density and FF requires a severer control. Therefore, the effect of the solar cell element according to the present invention can be sufficiently exerted.

The short circuit current Isc is preferably 8000 mA or more. The value of the short circuit current Isc can be controlled by the size of the solar cell element, and when the short circuit current density Jsc in the solar cell element according to the present invention is 35.5 mA/cm2, the area of the light receiving surface is required to be not less than the area of 15 cm×15 cm size rectangular element. By designing the size of the solar cell element so that the short circuit current Isc is in this range, it is possible to obtain an advantageous effect that the production cost can be reduced.

This irregular structure is closely related to the foregoing formula (4). In order to decrease the value of Sb/Sa, the direction that the depth of the irregularities decreases and the size of the irregularities in the horizontal direction increases, that is, the aspect ratio (vertical/horizontal) of the irregularities can be decreased. On the other hand, in order to increase the value of Sb/Sa, the direction that the depth of irregularities increases and the size of the irregularities in the horizontal direction decreases, that is, the aspect ratio (vertical/horizontal) of the irregularities can be increased. In order to increase the aspect ratio of the irregularities, the reaction pressure during the etching process can be decreased, while in order to decrease, the reaction pressure can be increased.

Meanwhile, in the case of wet etching, since the crystal plane orientations randomly scatter from grain to grain within the substrate plane as described above, it is difficult to uniformly form an irregularity structure, and therefore, as compared to a gas etching method such as the RIB process, it is difficult to freely control Sb/Sa with good reproducibility.

While in the foregoing description, roughening the surface of a multicrystalline silicon substrate by reactive ion etching in order to satisfy the formula $1.10 \leq Sb/Sa \leq 2.10$ is described as an example, the present invention is not limited to this example.

For example, it is also possible to form grooves in the region to be provided with the electrodes by means of laser or dicing, and then so as to embed the electrode material into the grooves. Also, the configuration and number of these grooves are not limited to specific ones, but may be a linear form, a dotted form, or combinations thereof.

Moreover, it is possible to preliminarily form projected portions in the region to be provided with the electrodes so as to satisfy the formula $1.10 \leq Sb/Sa \leq 2.10$ according to the present invention. The projected portions can be formed by etching the surface leaving the region to be provided with the electrodes. Also, in this case, the configuration and the number of projected portions are not limited to specific ones, but may be a linear form, dotted form, or combinations thereof. In addition, this method can be applied to a so-called selective emitter in which the surface concentration in the diffusion layer under the electrodes is increased and the layer is deepened, and the surface concentration of the diffusion layer in other regions is decreased and the layer is shallowed.

Furthermore, needless to say, it is possible to satisfy the formula $1.10 \leq Sb/Sa \leq 2.10$ also by carrying out reactive ion etching with the surface under the electrodes having been formed with grooves or projected portions.

Hereinafter, interconnection of the elements in a solar cell module according to the present invention will be described in detail referring to the drawings.

Figure 3A:
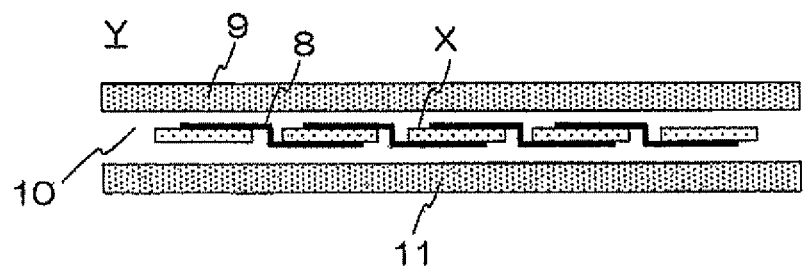
FIG. 3(a) illustrates a cross section of a solar cell module according to the present invention.
Figure 3B:
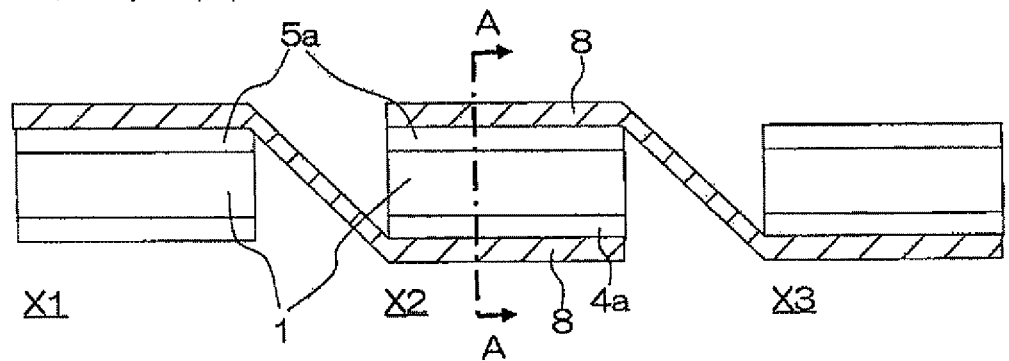
FIG. 3(b) is an enlarged cross-sectional view of FIG. 3(a).

The basic structure of the solar cell module is the same as the cross-sectional structure of the typical solar cell module shown in FIGS. 3(a) and 3(b).

When the solar cell elements are series connected, the surface side of a solar cell element X1 and the back surface side of an adjacent solar cell element X2 are electrically connected to each other by wiring members 8, and the back surface side is further electrically connected to the surface side of another adjacent solar cell element X3. By the repetition of this, a plurality of solar cell elements are electrically series connected.

The wiring members 8 of the solar cell elements at the ends are electrically interconnected by connecting members 6 described later to be connected a terminal box 7 (FIG. 13) disposed on the back surface of the solar cell module so that output power can be extracted outside.

A plurality of solar cell elements electrically interconnected by the wiring members 8 in this way are in a condition where they are two-dimensionally aligned in vertical and horizontal directions at predetermined intervals.

Figure 12:
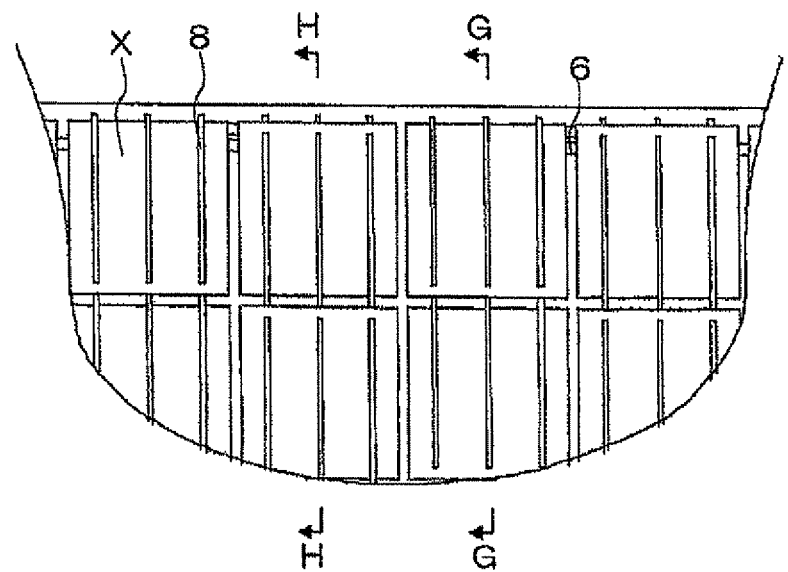
FIG. 12 is a partially enlarged view of an end portion on the light receiving surface side of a solar cell module according to the present invention.

FIG. 12 shows a partially enlarged view of an end region of the light receiving surface of a solar cell module according to the present invention.

A solar cell module according to the present invention is arranged such that the proportion of the sum of the areas of a plurality of solar cell elements packed in the solar cell module to the area of the light receiving surface side of the entire solar cell module is not less than 91.9% and not more than 97.7%.

In order to obtain such a high area proportion in this range, it is necessary to increase the area of each solar cell element as well as to narrow the intervals between the solar cell elements, that is, the area of a peripheral region of the solar cell module where solar cell elements are not present needs to be as small as possible.

As described above, in the solar cell module according to the present invention, while electrical connection between the solar cell elements being secured, the packing density of the solar cell elements within the solar cell module is increased. This not only makes it possible to improve the power generation efficiency of the solar cell module (amount of power generation/area of solar cell module), but also to give the entire solar cell module an impression of the same color as that of the solar cell elements, so that a beautiful exterior appearance can be given to the solar cell module to improve design quality.

In recent years, there are a wide variety of applications and types of usage of solar cell modules. There are not only rectangular solar cell modules, but also modules with pyramidal and trapezoidal shapes.

A rigid frame formed to have a hollow cross section formed by aluminum extrusion molding or the like is fit to the perimeter of a solar cell module so as to ensure the strength of the solar cell module, which is fixed to a stage preliminarily placed on a roof or the like by securing the frame with screws and used.

Also cases where a frame made of simple metal and a resin for protecting the perimeter from impact applied during the installation is fit to a solar cell module, and solar cell modules without frames (frameless module) are used as the roofing are increasing.

The present invention relates to all of the foregoing solar cell modules, and even when it is used with a frame fit thereto, a complete unit comprising a plurality of solar cell elements interconnected through wiring members 8 that are packed between a transparent panel 9 in the frame detached condition and a back surface protective member 11 is defined as a solar cell module, and the area of the light receiving surface side of the solar cell module refers to the area of regions located inside the perimeter of the complete unit.

It is preferred that when comparing the minimum distance between an end side of a solar cell element located at the outer most periphery and an end of the perimeter of the solar cell module with the minimum distance between the wiring members 8 interconnecting the solar cell elements or the connecting member 6 interconnecting the wiring members 8 and an end of the perimeter of the solar cell module, the shorter distance is not less than 5 mm and not more than 11 mm.

With this arrangement, it is possible to reduce the proportion of the perimeter region with a different color from that of the solar cell elements, thereby to provide the impression of the whole solar cell module with a shade of the dark color, which is between blue and dark blue near black, of the solar cell elements, by which the design quality of the solar cell module is further improved. At the same time, the high proportion of the area of the solar cell elements allows the power generation efficiency (amount of power generation/area of solar cell module) of the solar cell module to be improved.

In addition, the foregoing structure is preferred also for the following reason: while low cost, high efficiency and high design quality are required for solar cell modules, prior to these, it is needless to say that safety is necessary. In addition, since they are installed on the roofs of houses and the like, long-term reliability for use outdoors is also required. Accordingly, it is necessary to ensure insulation between the solar cell elements packed within the solar cell module and the outside so as to prevent air and water penetration. For this reason, in conventional modules, a large area where no solar cell elements, wiring members 8 or connecting members 6 are secured in the perimeter region. In addition, since most of the conventional solar cell modules include a rigid frame fit to the solar cell module for ensuring its strength, a fitting margin of about 1 cm is necessary. Because there has been no need for arranging the solar cell elements immediately under the frame, and because of the use of a rigid and thick frame, there are areas inside the frame, although not immediately under the frame, which are shaded with the frame depending on the angle of incidence of the sunlight. Therefore, there has been no need for arranging the solar cell elements closer to the perimeter of the solar cell module.

However, as describe above, because of the advent of simplified module frames and use of frameless modules, the fitting margin is reduced or not provided in increasing cases. For this reason, solar cell modules in which solar cell elements are disposed also in the perimeter region are required.

Meanwhile, to obtain the above described structure, measures such as thickening the filler member 10 to 1.0 mm or more, increasing the temperature of heat for the perimeter region of the solar cell module during the lamination process, or increasing the pressure for pressing the perimeter region during the lamination process may be taken.

In the case of a thicknesses of 5 mm or less, outside air or water may penetrate, as a result, insulation and long-term reliability cannot be ensured. Or, in the case of a thickness of 11 mm or more, in a module with a high packing density of solar cell elements, the perimeter region where no solar cell elements are present is so wide that the solar cell module appears to be a module with an edging, which is unpreferable in view of design.

Here, it is preferred to process the surfaces of the solar cell elements with an antireflective treatment for improving the efficiency, because its effect is particularly well exerted in solar cell modules in which the light diffusion/reflection effect is enhanced by the use of a color with a dark tone between blue and dark blue near black for the solar cell elements and the use of a white color for the filler member 10 or the back surface protective member 11 located on the back surface side of the solar cell elements within the solar cell module. This is because in this way, contrast in color tone between the solar cell elements and other areas is distinct, and the effect in design becomes remarkable.

Furthermore, in each of the foregoing embodiments, it is preferred that the spacing between the plurality of solar cell elements is not less than 70% and not more than 143% of the width of the wiring member 8.

This makes the spacing between the solar cell elements and the width of the wiring member 8 generally equal to each other so that the impression of the entire solar cell module appears to be penetrated with a plurality of lines in the same direction, which further improves the design quality of the solar cell module.

In addition, since narrowing the spacing between the solar cell elements to the level of the width of the wiring member 8 increases the proportion of the area of solar cell elements to the area of the solar cell module, it is possible to further improve the power generation efficiency (amount of power generation/area of solar cell module).

Meanwhile, in order to maximize the power generation efficiency of the solar cell module, the packing density of solar cell elements in a solar cell module reaches 100%. However, as described above, from viewpoints of safety (insulation) and long-term reliability, realizing the 100% packing density is impossible. Although there is a method so-called imbrication for connecting solar cell elements in which solar cell elements are overlapped each other in a part thereof, in this method, cracking is prone to occur in the solar cell elements when heated and pressed by the laminator, and optical loss is caused in the overlapping portions, which is therefore inefficient, causing the cost for modules to increase.

While the problems of cracking and optical loss may be eliminated if solar cell elements are arranged without spacing, when solar cell elements are series connected, due to the presence of wiring members 8 between the solar cell elements, which are each connected from the surface of one solar cell element to the back surface of the adjacent solar cell element as shown in FIG. 26, arranging them without spacing is substantially impossible. When the spacing between the solar cell elements is too narrow, end portions of the solar cell elements are pressed with an oblique force while being heated and pressed by a laminator, causing cracking to occur. This phenomenon often occurs particularly when the thickness of the wiring members 8 is large, or when a leadless Sn—Ag—Cu-based solder is used for coating the copper foil of the wiring members 8. This is because the Sn—Ag—Cu-based solders are hard.

In order to reduce the spacing between the solar cell elements to the level of the width of the wiring members 8, it is preferable that the wiring members 8 are preliminarily bent to conform with the configuration thereof for connecting solar cell elements adjacent to each other, so that occurrence of the foregoing problems can be restricted.

Meanwhile, a spacing between the solar cell elements of less than 70% of the width of the wiring members 8 is unpreferable, because in such a case, a stress applied to the connection portions between the solar cell elements and the wiring members 8 is increased, causing cracking to increase. When the spacing exceeds 143%, the spacing between the solar cell elements is too wide as compared with the width of the wiring members 8, which fails to make the impression of the solar cell module as a whole appear to be penetrated by a plurality of lines in the same direction. The design quality is therefore degraded and the power generation efficiency of the solar cell module is lowered.

Moreover, it is preferred that each of the foregoing embodiments is arranged such that all the widths of the wiring members 8 viewed from the light receiving surface side are generally identical.

With this structure, all the wiring members 8 have a uniform width, so that uniformity is enhanced while preventing imbalance, by which design quality is further improved. In particular, when this feature is combined with the foregoing embodiments of the present invention, because all the spacings between the solar cell elements and all the widths of the wring members 8 are viewed to be uniform, the solar cell module is bound to have high design quality. Here, the width of the wiring members 8 is preferably not less than 0.8 mm and not more than 2.0 mm, by which the wiring members 8 are made less noticeable. When it is smaller than this range, the cross section area is reduced to increase the resistance, which causes the characteristics to deteriorate. On the other hand, increasing the thickness to increase the cross section area causes the solar cell elements to crack in the vicinity of the spaces between the solar cell elements as mentioned above, which is therefore unpreferable. On the other hand, when it is greater than this range, the impression of lines that are formed by the wiring members 8, which seems to penetrate the solar cell module becomes too strong. That fails to suppress the impression of the whole solar cell elements with a shade of the dark color to deteriorate the design quality of the solar cell module. In addition, since the wiring members 8 reduce the light receiving area of the solar cell module, it is unpreferable that the output properties of the solar cell elements to deteriorate the output properties of the solar cell module.

It is preferred that the solar cell module according to the present invention is arranged, in each of the foregoing embodiments, such that connecting members 6 for electrically interconnecting wiring members 8 connect the wiring members 8 to each other at locations between the solar cell elements and the back surface protecting member 11, that is, at non-light-receiving locations.

This will be further described with reference to FIGS. 12-15.

Figure 13:
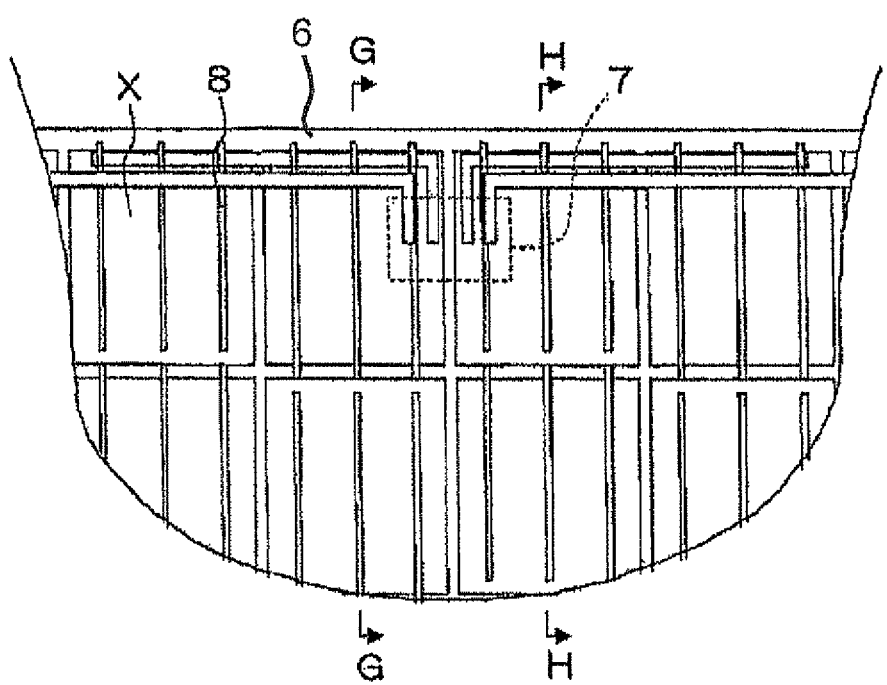
FIG. 13 is a partially enlarged view of an end portion on the non-light-receiving surface side of a solar cell module according to the present invention.

FIG. 12 is a partially enlarged view of an end region of the light receiving surface side of a solar cell module, and FIG. 13 is a partially enlarged view of an end region of the non-light-receiving surface side.

Figure 14:
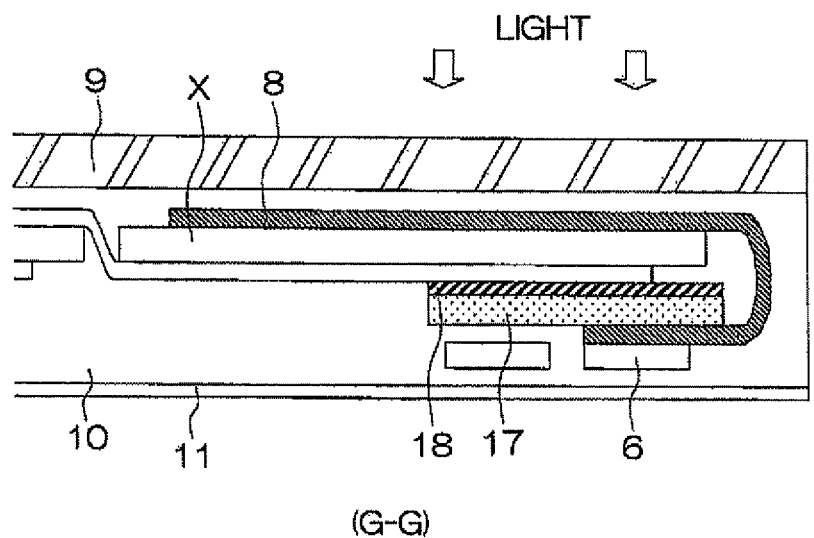
FIG. 14 is a view on arrow of a cross section of the solar cell module according to the present invention shown in FIGS. 12 and 13 cut along the line G-G.
Figure 15:
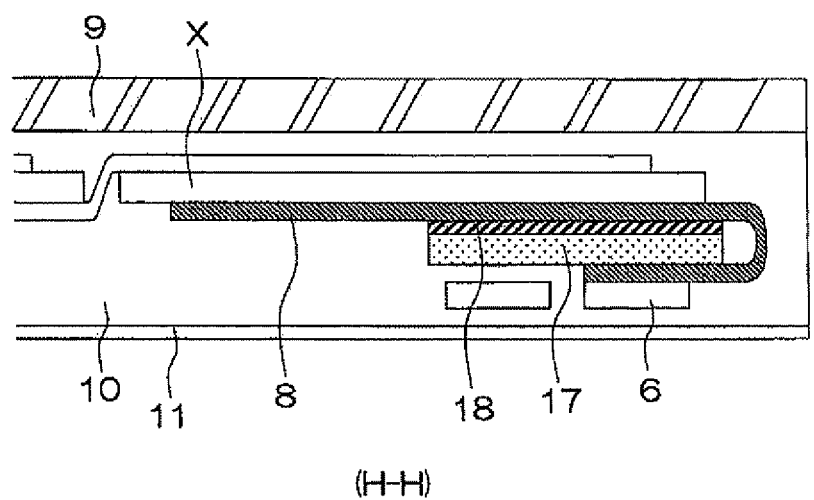
FIG. 15 is a view on arrow of a cross section of the solar cell module according to the present invention shown in FIGS. 12 and 13 cut along the line H-H.

In addition, FIG. 14 is a cross-sectional view on arrow of a solar cell module cut along the line G-G, and FIG. 15 is a cross-sectional view on arrow cut along the line H-H.

In each of the drawings, 6 denotes connecting members, 17 denotes a thermoflexible sheet and 18 denotes an insulation sheet. The same elements as those in FIGS. 1-11 are represented by the same reference numerals.

The connecting members 6 are members that transfer electric power from the group of solar cell elements interconnected through the wiring members 8 to the terminals of the terminal box 7, which are usually made by coating solder of about 20-70 μm thick over the entire surface of a copper foil having a thickness of about 0.1 mm-0.5 mm and a width of about 6 mm, and cutting it into predetermined lengths.

The terminal box 7 is a member for the connection of cables (not shown) for connecting output wiring lines from the solar cell elements to an circuit outside, and is made of a modified PPE resin or the like that is usually colored black, taking resistance to light such as ultraviolet rays into consideration. In many cases, the approximate size of the terminal box 7 is on the order of 100×60×20 mm for typical solar cell modules with output power of about 160 W.

According to the present invention, in order to electrically interconnect wiring members 8 by the connecting members 6 disposed at locations between the solar cell elements and the back surface protective member 11, as shown in FIGS. 14 and 15, wiring members 8 connected to the surface side or back surface side of the solar cell elements are bent toward the back surface protective member 11 and connected through the connecting members 6 by soldering or the like.

At this stage, in order to prevent short circuit to electrodes provided on the back surface side of the solar cell elements, it is preferable to interpose, for example, an insulation sheet 18 made of polyethyleneterephtalate (PET) between the wiring members 8 and the connecting members 16 that are turned to the solar cell elements and the back surface side of the solar cell elements.

In addition, due to the bent wiring members 8, the thickness is locally increased, which may cause the solar cell elements to crack upon application of heat and pressure during the laminating step in the solar cell module production process. To prevent this, it is also possible to interpose, for example, a thermoflexible sheet 17 made of an ethylene vinyl acetate copolymer (EVA) so as to absorb the stress.

Figure 16:
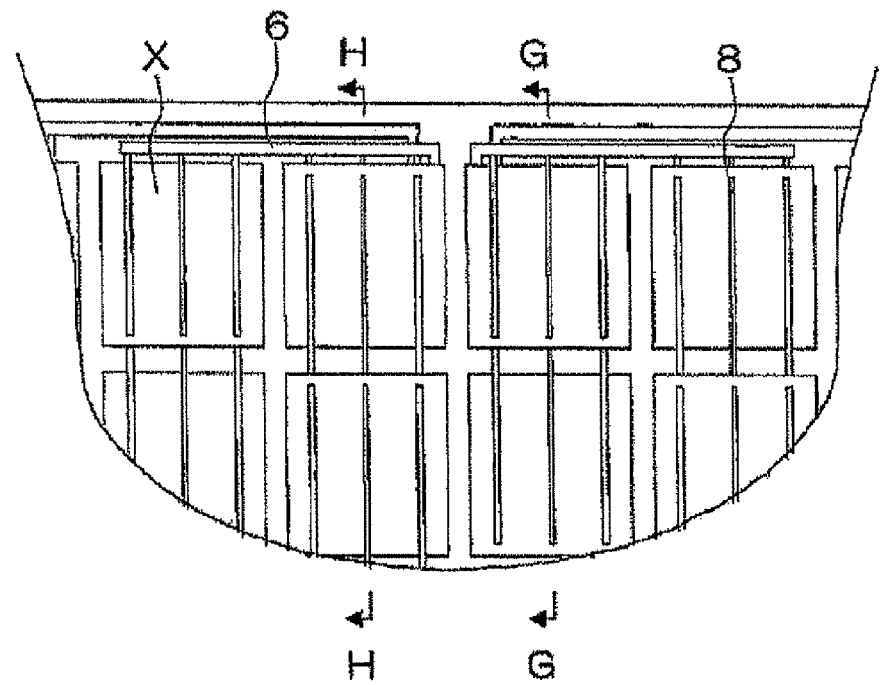
FIG. 16 is a partially enlarged view showing an end portion on the light receiving surface side of a conventional solar cell module.
Figure 17:
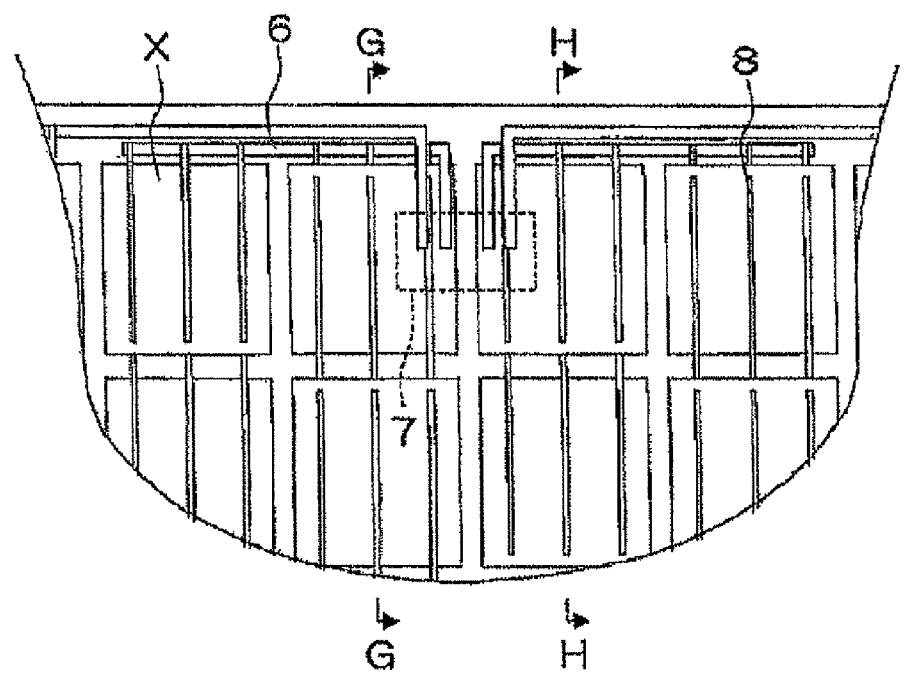
FIG. 17 is a partially enlarged view showing an end portion on the non-light-receiving surface side of the conventional solar cell module.
Figure 18:
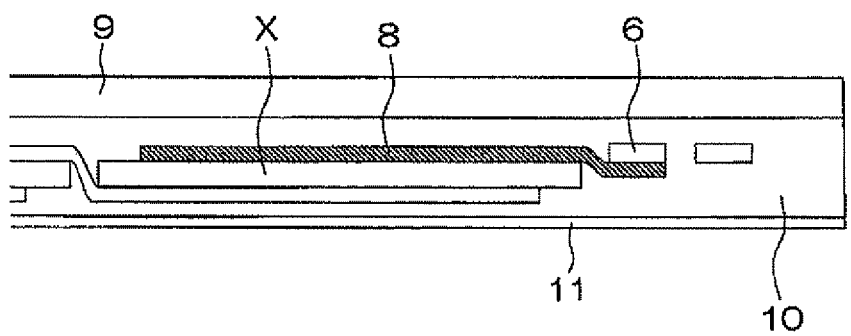
FIG. 18 is a view on arrow showing a cross section of the conventional solar cell module shown in FIGS. 16 and 17 cut along the line G-G.
Figure 19:
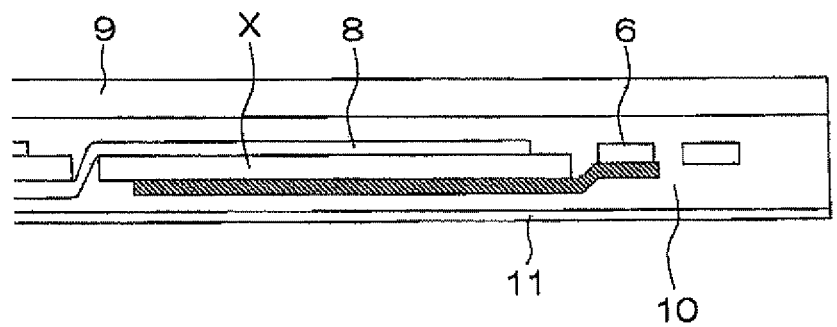
FIG. 19 is a view on arrow showing a cross section of the conventional solar cell module shown in FIGS. 16 and 17 cut along the line H-H.

While conventionally, as shown in FIGS. 16 and 17, the connecting members 6 are disposed in a perimeter region of the solar cell module without overlapping the solar cell elements, according to the present invention, connecting members 6 for interconnecting the wiring members 8 are provided on the back surface side of the solar cell elements.

With the foregoing structure according to the present invention, the packing density of the solar cell elements within the solar cell module can be further improved, and the conversion efficiency of the solar cell module can be improved.

In a conventional structure as shown in FIG. 16, connecting members 6 present in the perimeter region of the solar cell module are viewed as lines disturbing the uniformity of a plurality of lines formed by the wiring members 8 and lines between the solar cell elements. However, in the solar cell module arrangement according to this embodiment, since the connecting members 6 are located at regions invisible from the light receiving surface side, the appearance of the solar cell module can be further improved to have a higher design quality.

In addition, since the distance between the frame section and the solar cell elements can be narrowed to enable to reduce the area of the entire solar cell module, power generation efficiency per unit area of the solar cell module can be improved.

In the foregoing manner, a solar cell module according to the present invention can be obtained.

The solar cell module according to the present invention allows the production of a solar cell module with high design quality and high efficiency by a simple process without requiring additional members and steps. Therefore, a solar cell module with high efficiency and high design quality that is excellent in beauty of appearance can be realized. Since this module particularly exhibits its advantageous effect in solar cell modules whose exterior appearance is the key to determine the impression of the system, this is advantageously applied particularly to large scale solar modules whose one side length is on the order of 1 m or more. When this is applied to such a module having a long side, not only high power generation efficiency can be obtained, but also impression of the lines penetrating the solar cell module that are formed by the spaces between solar cell elements and wiring members 8 can be improved, so that the solar cell module can be a module with high design quality.

Meanwhile, implementation of the present invention is not limited to the foregoing embodiments, but various modifications may be made without departing from the spirit and scope of the present invention.

For example, while the description above is given to solar cells using p-type silicon substrates, also in cases where n-type silicon substrates are used, only by reversing the polarity in the description, the effect of the present invention can be achieved using the same process.

In addition, while in the foregoing description, a single junction type solar cell module is described, the present invention is applicable also to multijunction stacked type solar cell modules formed by laminating thin film bonding layers comprising a semiconductor multilayer film on a junction device using a bulk substrate.

The foregoing description is given to a solar cell element provided with two kinds of surface electrode including a surface electrode and a back surface electrode. However, the present invention is not limited to this type, but may be of a type including all the electrodes provided on non-light-receiving surface (back surface) side.

In addition, while surface electrode is described referring to those including bus bar electrodes with a generally linear shape and a plurality of finger electrodes whose one ends are connected thereto, it is not limited to this type.

Furthermore, while the foregoing description takes a multicrystalline silicon substrate fabricated by a casting method as an example, it is not necessary to limit the method to the casting method and to multicrystalline silicon. Also, the substrate is not limited to semiconductor substrates, but may be semiconductor thin films. The material is not necessarily a silicon material, but may be applicable to a semiconductor in general. That is, the present invention is applicable to compound solar cells and organic solar cells.

In addition, while bulk-type silicon solar cells are taken as example in the foregoing description, the present invention is not limited to these, but any desired mode may be included without departing from the principles and objects of the invention. That is, as long as it includes solar cell elements each comprising a semiconductor area having a light incident surface, and surface electrodes of generally linear shape provided on the light incident surface that collect light-produced carriers generated at the semiconductor area by irradiation of light on the light incident surface, it may be applied to a solar cell (element) in general such as optical sensors other than solar cells.

EXAMPLE

Hereinafter, the results of experiments conducted on solar cell elements fabricated according to the foregoing embodiments will be shown.

As the substrate, a flat plate p-type multicrystalline silicon substrate of 150 mm×150 mm in size fabricated by a casing method having a specific resistivity of 2 Ω·cm was used.

A paste including silver as a main component was printed and baked to form a surface electrode. The pattern for the surface electrode as a whole was formed by disposing three lines including one vertical line at the center of the substrate, and two lines axisymmetrically thereto. The bus bar electrodes 5a were made to have a length of 148.8 mm.

The widths of the bus bar electrodes 5a were varied to eight different values as 0.6, 0.8, 1.0, 1.2, 1.4, 1.6, 1.8, 2.0 mm.

The distance between the center lines of the bus bar electrodes 5a was 49.3 mm, the length of finger electrodes from one end to the other end of the substrate (including the widths of bus bar electrodes 5a crossing therebetween) that are arranged perpendicular to the bus bar electrodes and axisymmetrically to the vertical center line of the substrate was 149 mm, and the average distance between the center lines of adjacent finger electrodes was 2.4 mm.

Solar cell elements were fabricated by varying the width of the finger electrodes 2 between 10-200 μm.

Thereafter, 48 samples of the solar cell elements were connected together by wiring members having the same width as the bus bar electrodes to produce a solar cell module, and output characteristics were measured.

Tables 1, 2, 3 show short circuit current (Isc; unit A), Fill Factor (FF), conversion efficiency (Eff.; unit %) per cell, respectively, converted from the output characteristics of the solar cell module.

TABLE 1

| WIDTH OF FINGER ELECTRODE (mm) | WIDTH OF BUS BAR ELECTRODE (mm) | | | | | | | |
|---|---|---|---|---|---|---|---|---|
| | 0.6 | 0.8 | 1 | 1.2 | 1.4 | 1.6 | 1.8 | 2 |
| 0.01 | 8.410 | 8.437 | 8.473 | 8.503 | 8.528 | 8.547 | 8.561 | 8.569 |
| 0.02 | 8.421 | 8.446 | 8.478 | 8.505 | 8.526 | 8.542 | 8.552 | 8.556 |
| 0.03 | 8.429 | 8.451 | 8.480 | 8.504 | 8.521 | 8.534 | 8.540 | 8.541 |
| 0.04 | 8.435 | 8.455 | 8.480 | 8.500 | 8.514 | 8.523 | 8.526 | 8.523 |
| 0.05 | 8.438 | 8.455 | 8.478 | 8.494 | 8.505 | 8.510 | 8.509 | 8.503 |
| 0.06 | 8.440 | 8.455 | 8.473 | 8.486 | 8.493 | 8.494 | 8.490 | 8.480 |
| 0.07 | 8.438 | 8.451 | 8.466 | 8.475 | 8.478 | 8.476 | 8.468 | 8.455 |
| 0.08 | 8.435 | 8.445 | 8.456 | 8.462 | 8.461 | 8.456 | 8.444 | 8.427 |
| 0.09 | 8.429 | 8.437 | 8.444 | 8.446 | 8.442 | 8.433 | 8.418 | 8.397 |
| 0.1 | 8.420 | 8.426 | 8.430 | 8.428 | 8.421 | 8.407 | 8.389 | 8.364 |
| 0.11 | 8.410 | 8.413 | 8.413 | 8.408 | 8.396 | 8.380 | 8.357 | 8.329 |
| 0.12 | 8.396 | 8.397 | 8.394 | 8.385 | 8.370 | 8.350 | 8.324 | 8.292 |
| 0.13 | 8.381 | 8.379 | 8.372 | 8.359 | 8.341 | 8.317 | 8.287 | 8.252 |
| 0.14 | 8.363 | 8.359 | 8.348 | 8.332 | 8.310 | 8.282 | 8.248 | 8.209 |
| 0.15 | 8.342 | 8.336 | 8.321 | 8.301 | 8.276 | 8.244 | 8.207 | 8.164 |
| 0.16 | 8.319 | 8.311 | 8.292 | 8.269 | 8.239 | 8.204 | 8.163 | 8.117 |
| 0.17 | 8.294 | 8.283 | 8.261 | 8.233 | 8.200 | 8.162 | 8.117 | 8.067 |
| 0.18 | 8.266 | 8.252 | 8.227 | 8.196 | 8.159 | 8.116 | 8.068 | 8.014 |
| 0.19 | 8.236 | 8.220 | 8.190 | 8.156 | 8.115 | 8.069 | 8.017 | 7.959 |
| 0.2 | 8.203 | 8.184 | 8.151 | 8.113 | 8.069 | 8.019 | 7.963 | 7.901 |

TABLE 2

| WIDTH OF FINGER ELECTRODE (mm) | WIDTH OF BUS BAR ELECTRODE (mm) | | | | | | | |
|---|---|---|---|---|---|---|---|---|
| | 0.6 | 0.8 | 1 | 1.2 | 1.4 | 1.6 | 1.8 | 2 |
| 0.01 | 0.668 | 0.668 | 0.667 | 0.667 | 0.666 | 0.666 | 0.666 | 0.666 |
| 0.02 | 0.701 | 0.701 | 0.701 | 0.700 | 0.700 | 0.700 | 0.700 | 0.700 |
| 0.03 | 0.713 | 0.712 | 0.712 | 0.712 | 0.712 | 0.712 | 0.712 | 0.712 |
| 0.04 | 0.718 | 0.718 | 0.718 | 0.718 | 0.718 | 0.718 | 0.718 | 0.718 |
| 0.05 | 0.722 | 0.724 | 0.722 | 0.722 | 0.721 | 0.721 | 0.721 | 0.721 |
| 0.06 | 0.724 | 0.724 | 0.724 | 0.724 | 0.724 | 0.724 | 0.724 | 0.724 |
| 0.07 | 0.726 | 0.726 | 0.726 | 0.726 | 0.726 | 0.726 | 0.726 | 0.726 |
| 0.08 | 0.728 | 0.728 | 0.727 | 0.727 | 0.727 | 0.727 | 0.727 | 0.728 |
| 0.09 | 0.729 | 0.729 | 0.729 | 0.729 | 0.729 | 0.729 | 0.729 | 0.729 |
| 0.1 | 0.730 | 0.730 | 0.730 | 0.730 | 0.730 | 0.730 | 0.730 | 0.730 |
| 0.11 | 0.731 | 0.731 | 0.731 | 0.731 | 0.731 | 0.731 | 0.731 | 0.731 |
| 0.12 | 0.731 | 0.731 | 0.731 | 0.732 | 0.732 | 0.732 | 0.732 | 0.732 |
| 0.13 | 0.732 | 0.732 | 0.732 | 0.732 | 0.732 | 0.733 | 0.733 | 0.733 |
| 0.14 | 0.733 | 0.733 | 0.733 | 0.733 | 0.733 | 0.733 | 0.733 | 0.734 |
| 0.15 | 0.733 | 0.734 | 0.734 | 0.734 | 0.734 | 0.734 | 0.734 | 0.734 |
| 0.16 | 0.734 | 0.734 | 0.734 | 0.734 | 0.734 | 0.735 | 0.735 | 0.735 |
| 0.17 | 0.735 | 0.735 | 0.735 | 0.735 | 0.735 | 0.735 | 0.736 | 0.736 |
| 0.18 | 0.735 | 0.735 | 0.735 | 0.736 | 0.736 | 0.736 | 0.736 | 0.737 |
| 0.19 | 0.736 | 0.736 | 0.736 | 0.736 | 0.736 | 0.737 | 0.737 | 0.737 |
| 0.2 | 0.736 | 0.736 | 0.737 | 0.737 | 0.737 | 0.737 | 0.738 | 0.738 |

TABLE 3

| WIDTH OF FINGER ELECTRODE (mm) | WIDTH OF BUS BAR ELECTRODE (mm) | | | | | | | |
|---|---|---|---|---|---|---|---|---|
| | 0.6 | 0.8 | 1 | 1.2 | 1.4 | 1.6 | 1.8 | 2 |
| 0.01 | 14.979 | 15.014 | 15.059 | 15.103 | 15.120 | 15.140 | 15.150 | 15.151 |
| 0.02 | 15.732 | 15.768 | 15.814 | 15.848 | 15.870 | 15.890 | 15.900 | 15.893 |
| 0.03 | 15.991 | 16.022 | 16.065 | 16.096 | 16.120 | 16.130 | 16.130 | 16.119 |
| 0.04 | 16.118 | 16.148 | 16.184 | 16.208 | 16.220 | 16.230 | 16.220 | 16.207 |
| 0.05 | 16.192 | 16.219 | 16.249 | 16.268 | 16.280 | 16.280 | 16.260 | 16.241 |
| 0.06 | 16.238 | 16.259 | 16.283 | 16.295 | 16.300 | 16.290 | 16.270 | 16.244 |
| 0.07 | 16.264 | 16.282 | 16.299 | 16.305 | 16.300 | 16.290 | 16.260 | 16.227 |
| 0.08 | 16.227 | 16.290 | 16.301 | 16.300 | 16.290 | 16.270 | 16.240 | 16.196 |
| 0.09 | 16.280 | 16.289 | 16.293 | 16.286 | 16.270 | 16.240 | 16.200 | 16.155 |
| 0.1 | 16.274 | 16.278 | 16.276 | 16.262 | 16.240 | 16.200 | 16.160 | 16.104 |
| 0.11 | 16.260 | 16.260 | 16.251 | 16.231 | 16.200 | 16.160 | 16.110 | 16.046 |
| 0.12 | 16.241 | 16.236 | 16.221 | 16.194 | 16.160 | 16.110 | 16.050 | 15.982 |
| 0.13 | 16.214 | 16.205 | 16.183 | 16.149 | 16.110 | 16.050 | 15.990 | 15.910 |
| 0.14 | 16.182 | 16.169 | 16.140 | 16.099 | 16.050 | 15.990 | 15.910 | 15.832 |
| 0.15 | 16.143 | 16.126 | 16.090 | 16.042 | 15.990 | 15.920 | 15.840 | 15.748 |
| 0.16 | 16.100 | 16.077 | 16.035 | 15.980 | 15.920 | 15.840 | 15.760 | 15.658 |
| 0.17 | 16.051 | 16.024 | 15.975 | 15.194 | 15.840 | 15.760 | 15.670 | 15.563 |
| 0.18 | 15.997 | 15.966 | 15.910 | 15.841 | 15.760 | 15.670 | 15.570 | 15.463 |
| 0.19 | 15.938 | 15.902 | 15.839 | 15.763 | 15.680 | 15.580 | 15.470 | 15.357 |
| 0.2 | 15.873 | 15.832 | 15.762 | 15.680 | 15.590 | 15.480 | 15.370 | 15.245 |

As is apparent from these Tables, under the condition where the width of bus bar electrodes 5a is 1.4-2 mm, as the width of finger electrodes narrows, the short cut current increases, and the FF value decreases. Under the condition where the width of bus bar electrodes is 0.6-1.2 mm, while as the width of finger electrodes increases, the FF values increase, the short circuit current values peak at widths between 0.02 and 0.06 mm of finger electrodes.

However, the conversion efficiencies were as high as more than 16% at widths of 0.04-0.11 mm of finger electrodes irrespective of the width of bus bar electrodes. In particular, the conversion efficiencies peak at widths of 0.06-0.09 mm of finger electrodes.

Example 2

The relationship between the configuration of the surface electrode and the characteristic was investigated on a bulk-type crystalline silicon solar cell as the solar cell element fabricated according to the foregoing embodiment.

As the substrate, a flat plate p-type multicrystalline silicon substrate of 150 mm×155 mm in size fabricated by a casting method was used, and solar cell elements with the structure shown in FIG. 4(a) were formed.

A paste including silver as a main component was printed and baked to form the surface electrode according to the solar cell element of the present invention.

The pattern for the surface electrode as a whole was formed, such that when the substrate was oriented to have a length of 150 mm in the vertical direction and 155 mm in the horizontal direction in FIG. 4(a), the length of bus bars 5a disposed axisymmetrically to the vertical center line of the substrate was 147.5 mm, the width of the bus bar electrodes 5a is 2 mm, and the distance between the center lines of two bus bar electrodes 5a was 77.5 mm, the length of finger electrodes 5b from one end to the other end of the substrate (including the widths of bus bar electrodes 5a crossing therebetween) that are arranged perpendicular (vertical direction of the substrate) to the bus bar electrodes Sa and axisymmetrically to the vertical center line of the substrate was 152.8 mm, the average width of the finger electrodes 5b was 165 μm, and the average distance between the center lines of adjacent finger electrodes 5b was 2.38 mm.

Meanwhile, the average width of finger electrodes 5b was determined, as described above, by dividing the length between one end and the other end of connected to a bus bar electrode 5a into ten equal parts, and taking the average of widths measured at the respective points (9 points).

With this whole pattern being a common condition, experiments were conducted to examine the effects of the configurations of finger electrodes shown in FIGS. 4(b), 6 and 7.

First, an experiment was conducted in the case where the trajectory according to the solar cell element of the present invention as shown in FIG. 4(b), that is, the edge lines 22b of the contact surface 22a between the finger electrode 5b and the semiconductor substrate 1 include a rugged contour.

The results of the experiment are shown in Table 4. Here, the proportion of the area of the rugged contour portion to the area of the light incident surface is set to be approximately the same under any formation condition.

In addition, in Table 4, the proportions of perimeter corresponding to the degrees of the rugged contour when the perimeter in the case of edge line 22b of the contact surface 22a of the finger electrode 5b that does not include a rugged contour (i.e., generally linear shape) is standardized to 1 are shown. This corresponds to the value R in the following formula:

$$R = 0.5 L_1 (s_1 \cdot d_1^{-1} + d_1)^{-1}$$

Here, the distance of one cycle of the rugged contour was about 10-20 μm.

TABLE 4

| STANDARDIZED PERIMETER LENGTH R | EFFICIENCY | Isc [A] | Voc [V] | FF |
|---|---|---|---|---|
| 1.0 | 16.03 | 7.970 | 0.6143 | 0.761 |
| 1.2 | 16.06 | 7.971 | 0.6147 | 0.762 |
| 1.4 | 16.11 | 7.971 | 0.6149 | 0.764 |
| 1.6 | 16.13 | 7.971 | 0.6151 | 0.765 |

It is apparent from Table 4 that as the standardized perimeter increases, the efficiency increases, and the characteristics are improved. The reason for this is speculated that as a result of an increase of the substantial contact area by providing the edge lines 22b of the contact area 22a of finger electrode 5b with a rugged contour, the contact resistance decreased, by which the characteristics were improved.

Subsequently, an experiment for grasping the effect of the finger configuration shown in FIG. 7 was conducted.

In Table 5, the results of the experiment for the case where the standardized perimeter R in Table 4 is 1.4 are shown, in which, as shown in FIG. 7, the phase of an edge line with a rugged contour symmetric to the other one with respect to the center line of the finger electrode 5b in the same direction as the current flowing direction was shifted by a half cycle to form an asymmetric configuration.

TABLE 5

| STANDARDIZED PERIMETER LENGTH R | PHASE DIFFERENCE BETWEEN RUGGED CONTOURS | EFFI-CIENCY | Isc [A] | Voc [V] | FF |
|---|---|---|---|---|---|
| 1.4 | NONE | 16.11 | 7.971 | 0.6149 | 0.764 |
| 1.4 | HALF CYCLE | 16.14 | 7.970 | 0.6148 | 0.766 |

Table 5 shows that the efficiency increases by shifting the phase of the rugged contour by a half cycle, the effect of improving characteristics is thus apparent. That is, it is speculated that by shifting the phase of the rugged contour on one side by a half cycle to form an asymmetric configuration, constricted portions of the finger electrodes 5b were effectively resolved and the liner resistance was effectively reduced, thereby the characteristics of the finger electrodes 5b were improved.

Then, an experiment for grabbing the effect of the configuration of bus bar electrode shown in FIG. 9 was conducted.

A flat plate p-type multicrystalline silicon substrate of 150 mm×150 mm in size fabricated by a casing method was used to form a solar cell element with the structure shown in FIG. 1(a).

A paste including silver as a main component was printed and baked to form the surface electrode according to the present invention. The basic pattern for the surface electrode was formed to include three bus bar electrodes having the following dimensions.

The length of three bus bar electrodes 5a including one as the vertical center line of the substrate, and two disposed axisymmetrically thereto was 148.8 mm. The width of the bus bar electrodes 5a was 1.3 mm, the distance between the center lines of two bus bar electrodes 5a was 50 mm, the length of finger electrodes 5b from one end to the other end of the substrate (including the widths of bus bar electrodes 5a crossing therebetween) that are arranged perpendicular (vertical direction of the substrate) to the bus bar electrodes 5a and axisymmetrically to the vertical center line of the substrate was 149 mm, the width of the finger electrodes 5b was 80 μm, and the average distance between the center lines of adjacent finger electrodes 5b was 2.4 mm.

In addition, the lengths of the edge lines 32b when the contact surface 32a is planarly viewed from a vertical direction and the area $S_2$ were determined such that the solar cell element was photographed from a vertical direction and the surface image was digitized, which was thereafter converted into a binary form using a threshold value for separating the electrodes from areas other than these, thereby separating the area of the surface electrode from other areas.

Meanwhile, regarding the determination of the area $S_2$ and the length of the edge line 32b, the respective measured values was t-tested as a rejection test of outliers with a significance level of 0.05, and the validity thereof was confirmed.

The results of measurements of various characteristics of the solar cell element are shown in Table 3. Incidentally, the measurements of short circuit current (Isc) and fill factor (FF) as the characteristics of the solar cell element defined in JIS C 8913 (1998) were carried out based upon this standards.

In addition, the same experiment was conducted also on the horizontally long and vertically long multicrystalline silicon substrates (whose areas are the same as that of the foregoing substrate of 150×150 in size) shown in FIGS. 10(a) and 10(b). As for the bus bar electrodes 5a, two kinds that three and four were prepared for the horizontally long substrate, and two kinds that two and three were prepared for the vertically long substrate.

TABLE 6

| No | $S_3$ cm² | $S_2$ cm² | $L_2$ cm | $5 \cdot S_3^{1/2}$ | $S_2/S_3$ | Isc mA | Jsc mA/cm² | FF | η % | REMARKS |
|---|---|---|---|---|---|---|---|---|---|---|
| 1 | 225 | 2.9 | 93.2 | 75.0 | 0.013 | 8273 | 36.76 | 0.743 | 16.80 | |
| 2 | 225 | 3.6 | 92.5 | 75.0 | 0.016 | 8280 | 36.80 | 0.751 | 17.19 | |
| 3 | 225 | 5.6 | 90.8 | 75.0 | 0.025 | 8255 | 36.69 | 0.756 | 17.20 | |
| 4 | 225 | 7.9 | 89.8 | 75.0 | 0.035 | 8264 | 36.73 | 0.757 | 17.24 | |
| 5 | 225 | 9.5 | 92.6 | 75.0 | 0.042 | 8241 | 36.63 | 0.753 | 17.10 | |
| 6 | 225 | 12.4 | 91.4 | 75.0 | 0.055 | 8260 | 36.71 | 0.752 | 17.11 | |
| 7 | 225 | 14.2 | 91.6 | 75.0 | 0.063 | 8253 | 36.70 | 0.740 | 16.88 | |
| 8 | 225 | 5.2 | 70.4 | 75.0 | 0.023 | 7878 | 35.01 | 0.712 | 15.38 | HORIZONTALLY LONG BSB × 3 |
| 9 | 225 | 5.0 | 86.6 | 75.0 | 0.022 | 7938 | 35.28 | 0.731 | 15.62 | HORIZONTALLY LONG BSB × 4 |
| 10 | 225 | 5.9 | 80.3 | 75.0 | 0.026 | 7946 | 35.32 | 0.748 | 16.01 | VERTICALLY LONG BSB × 3 |
| 11 | 225 | 6.1 | 65.4 | 75.0 | 0.027 | 7942 | 35.30 | 0.748 | 16.01 | VERTICALLY LONG BSB × 2 |

It is apparent from Table 6 that the effect of improving the characteristics was noticeable in samples Nos. 2-6 and Nos. 9 and 10 that satisfied formulae (2) and (3) of the present invention.

Example 3

Subsequently, the relationship between the roughness of the contact surface between the surface electrode and the semiconductor substrate and the solar cell element characteristics was examined.

A flat plate p-type multicrystalline silicon substrate of 150 mm×150 mm in size fabricated by casting was used as the substrate to form a solar cell element with the structure shown in FIG. 1(a).

A paste including silver as a main component was printed and baked to form the surface electrode according to the present invention. The pattern for the surface electrode as a whole was formed according to the following dimensions. The length of two bus bar electrodes 5a disposed axisymmetrically to the vertical center line of the substrate was 148.8 mm. The width of the bus bar electrodes 5a was 2 mm, the distance between the center lines of two bus bar electrodes 5a was 75 mm, the length of finger electrodes 5b from one end to the other end of the substrate (including the widths of bus bar electrodes 5a crossing therebetween) that are arranged perpendicular (vertical direction of the substrate) to the bus bar electrodes Sa and axisymmetrically to the vertical center line of the substrate was 149 mm, the width of the finger electrodes 5b was 160 μm, and the average distance between the center lines of adjacent finger electrodes 5b was 2.4 mm. The results of measurements of various characteristics of this solar cell element are shown in Table 7.

In another case, the length of three bus bar electrodes 5a in total including one as the vertical center line of the substrate and two disposed axisymmetrically thereto was 148.8 mm. The width of the bus bar electrodes 5a was 1.3 mm, the distance between the center lines of the two bus bar electrodes 5a was 50 mm, the length of finger electrodes 5b from one end to the other end of the substrate (including the widths of bus bar electrodes 5a crossing therebetween) that are arranged perpendicular (vertical direction of the substrate) to the bus bar electrodes 5a and axisymmetrically to the vertical center line of the substrate was 149 mm, the width of the finger electrodes 5b was 80 μm, and the average distance between the center lines of adjacent finger electrodes 5b was 2.4 mm. Meanwhile, the average width of finger electrodes 5b was determined, as described above, by dividing the length between one end and the other end connected to bus bar electrodes 5a into ten equal parts, and taking the simple average of widths measured at the respective points (9 points). The results of measurements of various characteristics of this solar cell element are shown in Table 8.

The value of Sb was varied by roughening the portions that correspond to the areas under the electrodes by reaction ion etching. During this process, under $Cl_2$ gas flow of 0.1 slm, $O_2$ gas flow of 0.6 slm and $SF_6$ gas flow of 0.4 slm, an RF power of 5 kW was applied. In addition, to vary the value of Sb, the reactive gas pressure was varied as appropriate.

The values of Sb were measured after measurements of output characteristics of the solar cell elements by dipping them into aqua regia to remove the surface electrode, and the surface areas were measured on the region at which these electrodes was provided. For the measurements of surface areas, an AFM (atomic force microscope, Nanoscope IIIa produced by Digital Instruments, Inc.) was used to measure a 1 μm square sample at 512×1024 points at 0.2 Hz with use of a cantilever with a tip diameter of 5 nm. The measurements were carried out at 9 points, which was the same as measurements of the widths of finger electrodes, and then the simple average was calculated to determine the values.

The values of Sb/Sa were rounded off the number to the third decimal point, and comparisons were made to determine whether or not the values were within the range of the present invention.

Meanwhile, regarding the determination of the foregoing width of the finger electrodes and the area of the surface electrode, the respective measured values was t-tested as a rejection test of outliers with a significance level of 0.05, and the validity thereof was confirmed.

Incidentally, the measurements of short circuit current (Isc) and fill factor (FF) as the characteristics of the solar cell element defined in JIS C 8913 (1998) were carried out based upon this standards.

Furthermore, as a comparative example, the results of measurements on a solar cell element produced with conventional conditions are also listed as sample No. 32. Although the reactive ion etching process was used in this method, the sample was produced with conditions before the conditions with which the Sb/Sa values were within the range of the present invention was found.

TABLE 7

| No | LIGHT RECEIVING SURFACE AREA ($cm^2$) | Sa ($cm^2$) | Sb ($cm^2$) | Sb/Sa | Isc (mA) | Jsc (mA/$cm^2$) | FF | η (%) |
|---|---|---|---|---|---|---|---|---|
| 21* | 225 | 20.6 | 20.6 | 1.00 | 7951 | 35.34 | 0.73 | 15.61 |
| 22* | 225 | 20.6 | 21.6 | 1.05 | 7949 | 35.33 | 0.731 | 15.62 |
| 23 | 225 | 20.6 | 22.6 | 1.10 | 7946 | 35.32 | 0.748 | 16.01 |
| 24 | 225 | 20.6 | 24.7 | 1.20 | 7952 | 35.34 | 0.753 | 16.15 |
| 25 | 225 | 20.6 | 28.8 | 1.40 | 7963 | 35.39 | 0.756 | 16.19 |
| 26 | 225 | 20.6 | 32.9 | 1.60 | 7945 | 35.31 | 0.757 | 16.20 |
| 27 | 225 | 20.6 | 37.0 | 1.80 | 7968 | 35.41 | 0.759 | 16.26 |
| 28 | 225 | 20.6 | 39.1 | 1.90 | 7953 | 35.35 | 0.757 | 16.19 |
| 29 | 225 | 20.6 | 41.1 | 2.00 | 7944 | 35.31 | 0.747 | 16.01 |
| 30 | 225 | 20.6 | 43.2 | 2.10 | 7952 | 35.34 | 0.752 | 16.08 |
| 31* | 225 | 20.6 | 45.2 | 2.20 | 7942 | 35.30 | 0.732 | 15.63 |
| 32* | 225 | 20.6 | 22.0 | 1.07 | 7950 | 35.33 | 0.732 | 15.61 |

*Samples out of the range of the invention

TABLE 8

| No | LIGHT RECEIVING SURFACE AREA ($cm^2$) | Sa ($cm^2$) | Sb ($cm^2$) | Sb/Sa | Isc (mA) | Jsc (mA/$cm^2$) | FF | η (%) |
|---|---|---|---|---|---|---|---|---|
| 21* | 225 | 13.1 | 13.1 | 1.00 | 8267 | 36.74 | 0.738 | 16.81 |
| 22* | 225 | 13.1 | 13.8 | 1.05 | 8272 | 36.76 | 0.743 | 16.80 |
| 23 | 225 | 13.1 | 14.4 | 1.10 | 8281 | 36.80 | 0.751 | 17.19 |
| 24 | 225 | 13.1 | 15.7 | 1.20 | 8241 | 36.63 | 0.753 | 17.10 |
| 25 | 225 | 13.1 | 18.4 | 1.40 | 8255 | 36.69 | 0.756 | 17.20 |
| 26 | 225 | 13.1 | 21.0 | 1.60 | 8298 | 36.88 | 0.757 | 17.31 |
| 27 | 225 | 13.1 | 23.6 | 1.80 | 8278 | 36.79 | 0.759 | 17.31 |
| 28 | 225 | 13.1 | 24.9 | 1.90 | 8264 | 36.73 | 0.757 | 17.24 |
| 29 | 225 | 13.1 | 26.2 | 2.00 | 8271 | 36.76 | 0.754 | 17.18 |
| 30 | 225 | 13.1 | 27.5 | 2.10 | 8259 | 36.71 | 0.752 | 17.11 |
| 31* | 225 | 13.1 | 28.9 | 2.20 | 8258 | 36.70 | 0.74 | 16.76 |
| 32* | 225 | 13.1 | 13.9 | 1.06 | 8270 | 36.76 | 0.741 | 16.79 |

*Samples out of the range of the invention

As Table 7 shows, the values of short circuit current are more than 35.3 mA/$cm^2$ when 1.10≤Sb/Sa≤2.10, that is, for samples Nos. 23-30, and FF values are as high as more than 0.747. On the other hand, although samples Nos. 21 and 22 whose Sb/Sa values are less than 1.10 exhibit short circuit current values almost at the same level, FF values are so low as 0.731 or less. Also, in the case of sample No. 31 whose Sb/Sa value exceeds 2.10, the FF value dropped to 0.732. This shows that solar cell elements having high conversion efficiencies exceeding 16% can be obtained in the condition of 1.10≤Sb/sa≤2.10.

Also in the case of the solar cell element provided with three bus bar electrodes having a width of 1.3 mm shown in Table 8, the short circuit current density values areas high as more than 36.6 mA/cm$^2$ in the range of 1.10≤Sb/sa≤2.10, that is, for samples Nos. 23-30, and also the FF values thereof are all as high as more than 0.75. As a result, solar cell elements with high conversion efficiencies of more than 17% can be obtained in the range of 1.10≤Sb/sa≤2.10.

By the way, in either case of FIG. 7 or FIG. 8, the FF values tend to decrease in solar cell elements of sample No. 32 produced with the conventional conditions as compared with solar cell elements according to the present invention.

When the solar cell modules shown in FIGS. 12-14 were produced using the solar cell elements of the present invention fabricated in the foregoing way, good results were obtained.

The invention claimed is:

1. A solar cell module comprising:
    a plurality of solar cell strings, each of the solar cell strings comprising a plurality of solar cell elements arranged in a line and electrically connected in series, wherein each of the solar cell strings comprises an end solar cell element at an end in the line;
    a connecting member electrically connecting two of the end solar cell elements of two adjacent solar cell strings on a back surface of the solar cell strings;
    wiring members, each coupling one of the end solar cell elements to the connecting member; and
    a terminal box for extracting electric power electrically connected to the connecting member,
    wherein each wiring member is connected to either front or back surface of a first end solar cell element at a first end and is connected to the connecting member at a second end,
    wherein each wiring member is bent in a direction from a front surface to the back surface at a peripheral edge of the first end solar cell element and further bent in a direction from the second end to the first end such that the connecting member does not extend past the peripheral edge of the first end solar cell element.

2. The solar cell module according to claim 1, further comprising an insulation sheet between the back surface of the end solar cell elements adn the writing members bent in a direction from the second end to the first end.

3. The solar cell module according to claim 2, wherein the insulation sheet is made of a polyethylene terephthalate.

4. The solar cell module according to claim 1, further comprising a flexible sheet between the back surface of the end solar cell elements and the writing members bent in a direction from the second end to the first end.

5. The solar cell module according to claim 4, wherein the flexible sheet is made of an ethylene vinyl acetate copolymer.

6. The solar cell module according to claim 1, wherein a spacing between an adjacent pair of the plurality of solar cell elements is in a range of 70% to 143% by the width of the first wiring member.

7. The solar cell module according to claim 1, wherein all widths of the first wiring members viewed from the light receiving surface side are substantially the same.

8. The solar cell module according to claim 1, wherein a width of the first wiring member is in a range of 0.8 mm to 2.0 mm.

9. A photovoltaic power generator comprising one or a plurality of the solar cell modules connected to each other, each solar cell module is according to claim 1.

10. The solar cell module according to claim 1, wherein each of the wiring members comprises:
    a first portion coupled to the end solar cell element;
    a second portion coupled to the connecting member; and
    a third portion coupled to the first and second portions.

11. The solar cell module according to claim 1, wherein the wiring member is J-shaped.

12. The solar cell module according to claim 1, wherein the wiring member includes a U-shaped region.

* * * * *

UNITED STATES PATENT AND TRADEMARK OFFICE
CERTIFICATE OF CORRECTION

| | | |
|---|---|---|
| PATENT NO. | : 8,975,506 B2 | Page 1 of 1 |
| APPLICATION NO. | : 13/273056 | |
| DATED | : March 10, 2015 | |
| INVENTOR(S) | : Fujii et al. | |

It is certified that error appears in the above-identified patent and that said Letters Patent is hereby corrected as shown below:

In the Claims

Column 38, Claim 2
Line 9, delete "adn the writing members" and replace with -- and the wiring members --

Column 38, Claim 4
Line 15, delete "the writing members" and replace with -- the wiring members --

Signed and Sealed this
Thirtieth Day of June, 2015

Michelle K. Lee
*Director of the United States Patent and Trademark Office*